United States Patent
Seo et al.

(10) Patent No.: US 9,608,224 B2
(45) Date of Patent: *Mar. 28, 2017

(54) ORGANIC LIGHT EMITTING ELEMENT AND DISPLAY DEVICE USING THE ELEMENT

(71) Applicant: Semiconductor Energy Laboratory Co., Ltd., Atsugi-shi, Kanagawa-ken (JP)

(72) Inventors: Satoshi Seo, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/945,584

(22) Filed: Nov. 19, 2015

(65) Prior Publication Data

US 2016/0079555 A1 Mar. 17, 2016

Related U.S. Application Data

(60) Continuation of application No. 14/188,741, filed on Feb. 25, 2014, now Pat. No. 9,219,241, which is a (Continued)

(30) Foreign Application Priority Data

Feb. 1, 2001 (JP) ................................ 2001-025971

(51) Int. Cl.
*H01L 35/24* (2006.01)
*H01L 51/50* (2006.01)
*H01L 27/32* (2006.01)

(52) U.S. Cl.
CPC ...... *H01L 51/5016* (2013.01); *H01L 27/3211* (2013.01); *H01L 27/3244* (2013.01);
(Continued)

(58) Field of Classification Search
CPC ............. H01L 51/5016; H01L 51/5008; H01L 51/5048
(Continued)

(56) References Cited

U.S. PATENT DOCUMENTS

| 3,654,525 A | 4/1972 | Maricle et al. |
| 5,017,863 A | 5/1991 | Mellitz |

(Continued)

FOREIGN PATENT DOCUMENTS

| EP | 1011155 B | 6/2000 |
| EP | 1065737 A | 1/2001 |

(Continued)

OTHER PUBLICATIONS

Adachi.C et al., "Electroluminescence in Organic Films With Three-Layer Structure", Jpn. J. Appl. Phys. (Japanese Journal of Applied Physics), Feb. 20, 1988, vol. 27, No. 2, pp. L269-L271.
(Continued)

*Primary Examiner* — Anthony Ho
(74) *Attorney, Agent, or Firm* — Fish & Richardson P.C.

(57) ABSTRACT

A hole transporting region made of a hole transporting material, an electron transporting region made of an electron transporting material, and a mixed region (light emitting region) in which both the hole transporting material and the electron transporting material are mixed and which is doped with a triplet light emitting material for red color are provided in an organic compound film, whereby interfaces between respective layers which exist in a conventional lamination structure are eliminated, and respective functions of hole transportation, electron transportation, and light
(Continued)

emission are exhibited. In accordance with the above-mentioned method, the organic light emitting element for red color can be obtained in which power consumption is low and a life thereof is long. Thus, the display device and the electric device are manufactured by using the organic light emitting element.

21 Claims, 20 Drawing Sheets

Related U.S. Application Data continuation of application No. 13/444,889, filed on Apr. 12, 2012, now Pat. No. 8,674,348, which is a continuation of application No. 12/978,678, filed on Dec. 27, 2010, now Pat. No. 8,174,007, which is a continuation of application No. 12/325,790, filed on Dec. 1, 2008, now Pat. No. 7,858,977, which is a continuation of application No. 11/564,971, filed on Nov. 30, 2006, now Pat. No. 7,459,722, which is a division of application No. 10/060,427, filed on Jan. 29, 2002, now Pat. No. 7,173,370.

(52) U.S. Cl.
CPC ...... *H01L 51/5008* (2013.01); *H01L 51/5048* (2013.01); *H01L 27/3281* (2013.01); *H01L 51/5096* (2013.01); *H01L 2251/5376* (2013.01); *H01L 2251/5384* (2013.01)

(58) Field of Classification Search
USPC ............................................ 257/40, E51.001
See application file for complete search history.

(56) References Cited

U.S. PATENT DOCUMENTS

| | | | |
|---|---|---|---|
| 5,039,657 A | 8/1991 | Goldman et al. |
| 5,170,990 A | 12/1992 | Kamiya et al. |
| 5,256,945 A | 10/1993 | Imai et al. |
| 5,271,089 A | 12/1993 | Ozawa |
| 5,281,489 A | 1/1994 | Mori et al. |
| 5,485,055 A | 1/1996 | Keyser |
| 5,486,406 A | 1/1996 | Shi |
| 5,513,499 A | 5/1996 | Derijke |
| 5,703,436 A | 12/1997 | Forrest et al. |
| 5,719,467 A | 2/1998 | Antoniadis et al. |
| 5,742,129 A | 4/1998 | Nagayama et al. |
| 5,756,224 A | 5/1998 | Borner et al. |
| 5,817,431 A | 10/1998 | Shi et al. |
| 5,837,391 A | 11/1998 | Utsugi |
| 5,853,905 A | 12/1998 | So et al. |
| 5,858,563 A | 1/1999 | Sano et al. |
| 5,925,472 A | 7/1999 | Hu et al. |
| 5,925,980 A | 7/1999 | So et al. |
| 5,932,363 A | 8/1999 | Hu et al. |
| 5,932,892 A | 8/1999 | Hseuh et al. |
| 5,932,895 A | 8/1999 | Shen et al. |
| 5,955,836 A | 9/1999 | Boerner et al. |
| 5,989,737 A | 11/1999 | Xie et al. |
| 6,030,715 A | 2/2000 | Thompson et al. |
| 6,046,547 A | 4/2000 | Nishio et al. |
| 6,072,278 A | 6/2000 | Keyser et al. |
| 6,097,147 A | 8/2000 | Baldo et al. |
| 6,114,055 A | 9/2000 | Choong et al. |
| 6,121,727 A | 9/2000 | Kanai et al. |
| 6,130,001 A | 10/2000 | Shi et al. |
| 6,132,280 A | 10/2000 | Tanabe et al. |
| 6,133,693 A | 10/2000 | Keyser |
| 6,175,345 B1 | 1/2001 | Kuribayashi et al. |
| 6,191,764 B1 | 2/2001 | Kono et al. |
| 6,194,837 B1 | 2/2001 | Ozawa |
| 6,204,610 B1 | 3/2001 | Komiya |
| 6,215,462 B1 | 4/2001 | Yamada et al. |
| 6,228,228 B1 | 5/2001 | Singh et al. |
| 6,237,529 B1 | 5/2001 | Spahn |
| 6,275,649 B1 | 8/2001 | Nagashima et al. |
| 6,284,050 B1 | 9/2001 | Shi et al. |
| 6,285,039 B1 | 9/2001 | Kobori et al. |
| 6,310,360 B1 | 10/2001 | Forrest et al. |
| 6,326,091 B1 | 12/2001 | Schoo et al. |
| 6,359,606 B1 | 3/2002 | Yudasaka |
| 6,368,730 B1 | 4/2002 | Kishimoto et al. |
| 6,372,154 B1 | 4/2002 | Li |
| 6,392,250 B1 | 5/2002 | Aziz et al. |
| 6,392,339 B1 | 5/2002 | Aziz et al. |
| 6,396,209 B1 | 5/2002 | Kido et al. |
| 6,413,656 B1 | 7/2002 | Thompson et al. |
| 6,432,255 B1 | 8/2002 | Sun et al. |
| 6,458,475 B1 | 10/2002 | Adachi et al. |
| 6,468,676 B1 | 10/2002 | Ueda et al. |
| 6,495,198 B2 | 12/2002 | Peng |
| 6,517,996 B1 | 2/2003 | Chao et al. |
| 6,528,824 B2 | 3/2003 | Yamagata et al. |
| 6,541,909 B1 | 4/2003 | Motomatsu |
| 6,558,817 B1 | 5/2003 | Ueda et al. |
| 6,559,065 B2 | 5/2003 | Kawashima |
| 6,566,807 B1 | 5/2003 | Fujita et al. |
| 6,593,690 B1 | 7/2003 | Mccormick et al. |
| 6,603,140 B2 | 8/2003 | Kobori et al. |
| 6,614,175 B2 | 9/2003 | Aziz et al. |
| 6,645,645 B1 | 11/2003 | Adachi et al. |
| 6,664,732 B2 | 12/2003 | Yamazaki et al. |
| 6,682,782 B2 | 1/2004 | Jung et al. |
| 6,699,597 B2 | 3/2004 | Bellmann et al. |
| 6,730,966 B2 | 5/2004 | Koyama |
| 6,734,457 B2 | 5/2004 | Yamazaki et al. |
| 6,737,177 B2 | 5/2004 | Aziz et al. |
| 6,750,608 B2 | 6/2004 | Matsuura et al. |
| 6,753,098 B2 | 6/2004 | Aziz et al. |
| 6,759,144 B2 | 7/2004 | Toguchi et al. |
| 6,798,135 B2 | 9/2004 | Lin et al. |
| 6,803,720 B2 | 10/2004 | Kwong et al. |
| 6,818,325 B2 | 11/2004 | Mishima et al. |
| 6,821,645 B2 | 11/2004 | Igarashi et al. |
| 6,830,828 B2 | 12/2004 | Thompson et al. |
| 6,831,406 B1 | 12/2004 | Fukuyama et al. |
| 6,835,469 B2 | 12/2004 | Kwong et al. |
| 6,878,470 B2 | 4/2005 | Kawamura et al. |
| 6,908,694 B2 | 6/2005 | Moriyama et al. |
| 6,910,933 B1 | 6/2005 | Matsuo et al. |
| 6,939,624 B2 | 9/2005 | Lamansky et al. |
| 7,173,370 B2 | 2/2007 | Seo et al. |
| 7,339,317 B2 | 3/2008 | Yamazaki |
| 7,400,087 B2 | 7/2008 | Yamazaki |
| 7,459,722 B2 | 12/2008 | Seo et al. |
| 7,858,977 B2 | 12/2010 | Seo et al. |
| 7,915,808 B2 | 3/2011 | Yamazaki |
| 8,674,348 B2* | 3/2014 | Seo ............. H01L 27/3211 257/40 |
| 9,219,241 B2* | 12/2015 | Seo ............. H01L 27/3211 |
| 2001/0051207 A1 | 12/2001 | Yamagata et al. |
| 2002/0034659 A1 | 3/2002 | Nishi et al. |
| 2002/0086180 A1 | 7/2002 | Seo et al. |
| 2002/0093283 A1 | 7/2002 | Seo et al. |
| 2002/0105005 A1 | 8/2002 | Seo et al. |
| 2002/0109136 A1 | 8/2002 | Seo et al. |
| 2002/0113546 A1 | 8/2002 | Seo et al. |
| 2002/0121860 A1 | 9/2002 | Seo et al. |
| 2002/0139303 A1 | 10/2002 | Yamazaki et al. |
| 2002/0155632 A1 | 10/2002 | Yamazaki et al. |
| 2003/0010288 A1 | 1/2003 | Yamazaki et al. |
| 2003/0044639 A1 | 3/2003 | Fukuda |
| 2003/0118950 A1 | 6/2003 | Chao et al. |
| 2011/0156580 A1 | 6/2011 | Yamazaki |

FOREIGN PATENT DOCUMENTS

| | | |
|---|---|---|
| EP | 1220340 A | 7/2002 |
| JP | 03-114197 A | 5/1991 |
| JP | 04-357694 A | 12/1992 |

(56) References Cited

FOREIGN PATENT DOCUMENTS

| JP | 05-335080 A | 12/1993 |
|---|---|---|
| JP | 05-347188 A | 12/1993 |
| JP | 08-330073 A | 12/1996 |
| JP | 10-060427 A | 3/1998 |
| JP | 10-162955 A | 6/1998 |
| JP | 10-233288 A | 9/1998 |
| JP | 2000-156290 A | 6/2000 |
| JP | 2000-208262 A | 7/2000 |
| JP | 2001-023776 A | 1/2001 |
| JP | 2001-052870 A | 2/2001 |
| JP | 2002-043063 A | 2/2002 |
| JP | 2004-515895 | 5/2004 |
| TW | 243470 | 3/1995 |
| TW | 366598 | 8/1999 |
| TW | 451601 | 8/2001 |
| WO | WO-98/08360 | 2/1998 |
| WO | WO-00/16593 | 3/2000 |
| WO | WO-02/47457 | 6/2002 |

OTHER PUBLICATIONS

Search Report (Application No. 200200365.5) Dated Nov. 11, 2003.
Written Opinion (Application No. 200200365.5) Dated May 19, 2004.
Search Report (Application No. 200200037-0) Dated Oct. 7, 2003.
Kido.J et al., "Multilayer White Light-Emitting Organic Electroluminescent Device", Science, Mar. 3, 1995, vol. 267, No. 5202, pp. 1332-1334.
Kijima.Y et al., "A Blue Organic Light Emitting Diode", Jpn. J. Appl. Phys. (Japanese Journal of Applied Physics), Sep. 15, 1999, vol. 38, No. 9A, pp. 5274-5277.
Thompson.M et al., "Phosphorescent Materials and Devices", Proceedings of the 10th International Workshop on Inorganic and Organic Electroluminescence (EL'00), Dec. 4, 2000, pp. 35-38.
Tsutsui.T, "New Aspect of Research and Development of Organic EL", M & BE Seminar, Bulletin of Organic Molecular / Bioelectronics Subcommittee, Society of Applied Physics, 2000, vol. 11, No. 1, pp. 3-12, Division of Molecular Electronics and Bioelectronics, The Japan Society of Applied Physics.
O'Brien.D et al., "Improved Energy Transfer in Electrophosphorescent Devices", Appl. Phys. Lett. (Applied Physics Letters), Jan. 18, 1999, vol. 74, No. 3, pp. 442-444.
Sato.Y, "Problem for Implementation in View of Materials Development", Molecular Electronics and Bioelectronics, Feb. 1, 2000, vol. 11, No. 1, pp. 86-99, Division of Molecular Electronics and Bioelectronics,The Japan Society of Applied Physics.
Tang.C et al., "Organic Electroluminescent Diodes", Appl. Phys. Lett. (Applied Physics Letters), Sep. 21, 1987, vol. 51, No. 12, pp. 913-915.
Tang.C et al., "Electroluminescence of Doped Organic Thin Films", J. Appl. Phys. (Journal of Applied Physics), May 1, 1989, vol. 65, No. 9, pp. 3610-3616.
Nishi.T et al., "High Efficiency TFT-OLED Display With Iridium-Complex as Triplet Emissive Center", Proceedings of the 10th International Workshop on Inorganic and Organic Electroluminescence (EL'00), Dec. 4, 2000, pp. 353-356.
Tsutsui.T et al., "High Quantum Efficiency in Organic Light-Emitting Devices With Iridium-Complex as a Triplet Emissive Center", Jpn. J. Appl. Phys. (Japanese Journal of Applied Physics), Dec. 15, 1999, vol. 38, No. 12B, pp. L1502-L1504.
Tsutsui.T, "Mechanism of Organic EL Element and Luminous Efficiency", Textbook of the 3rd Seminar at Division of Organic Molecular Electronics and Bioelectronics, 1993, pp. 31-37, Division of Molecular Electronics and Bioelectronics The Japan Society of Applied Physics.
Vanslyke.S et al., "Organic Electroluminescent Devices With Improved Stability", Appl. Phys. Lett. (Applied Physics Letters), Oct. 7, 1996, vol. 69, No. 15, pp. 2160-2162.
Wakimoto.T et al., "Organic EL Cells Using Alkaline Metal Compounds as Electron Injection Materials", IEEE Transactions on Electron Devices, Aug. 1, 1997, vol. 44, No. 8, pp. 1245-1248.
Baldo.M et al., "Highly Efficient Phosphorescent Emission From Organic Electroluminescent Devices", Nature, Sep. 10, 1998, vol. 395, pp. 151-154.
Office Action (Application No. 200710182287.4) Dated Dec. 19, 2008.

* cited by examiner

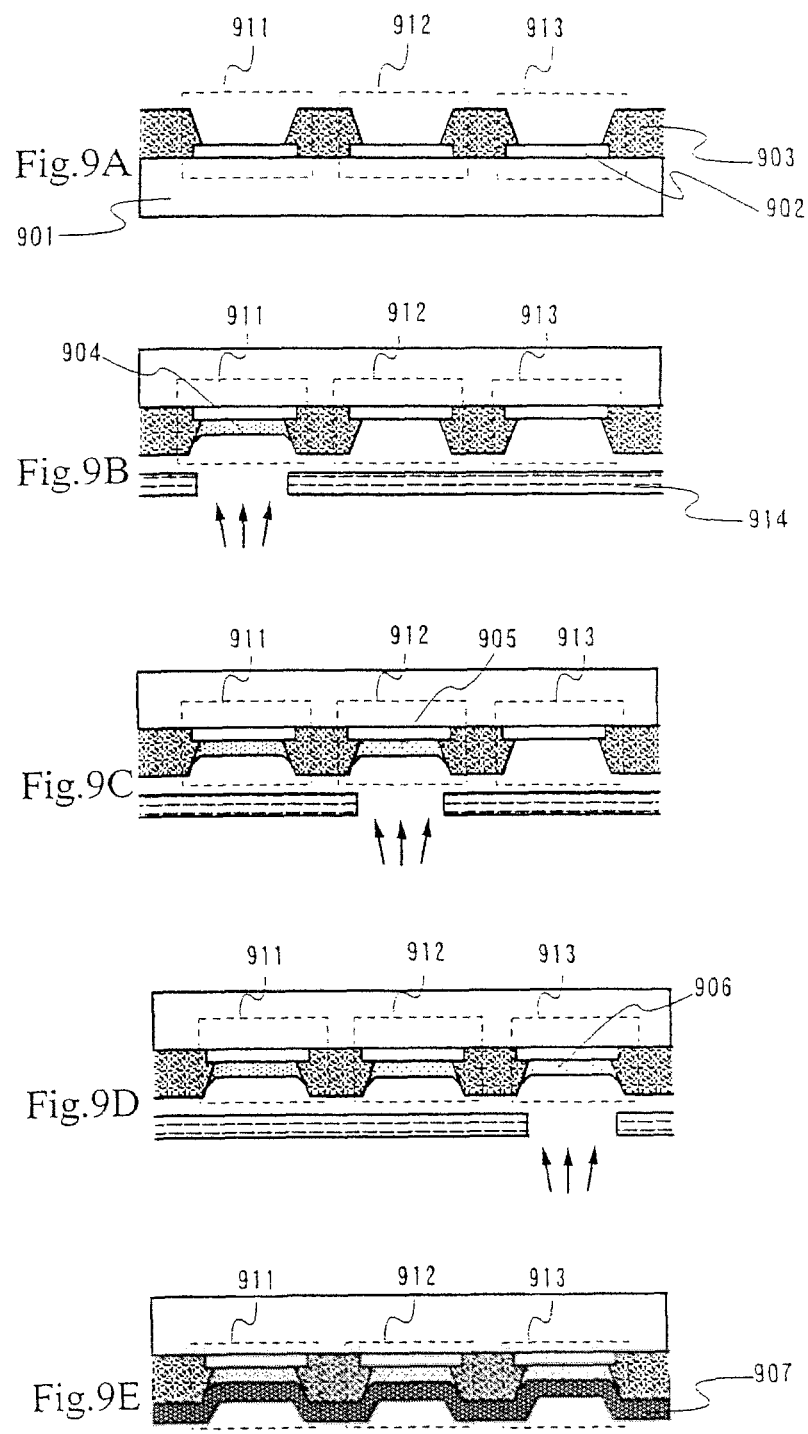

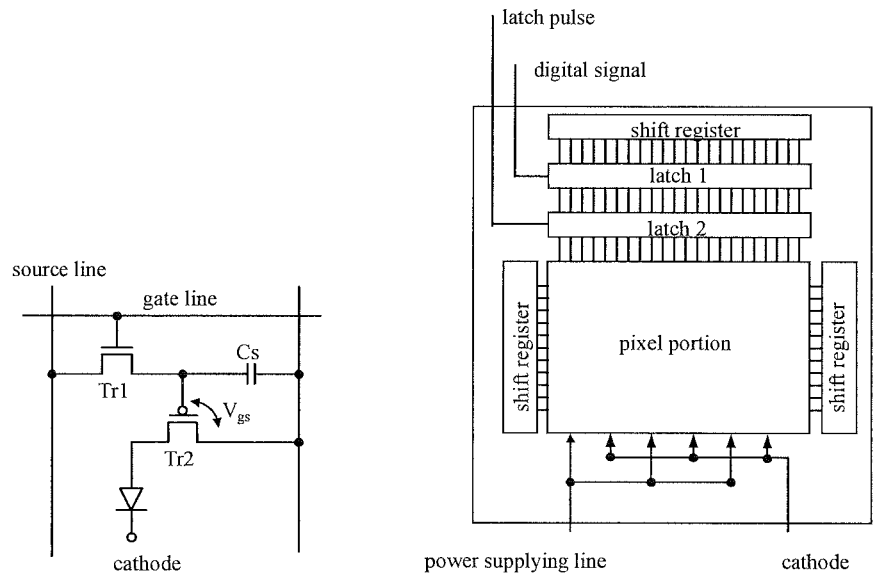
FIG. 18A
FIG. 18B
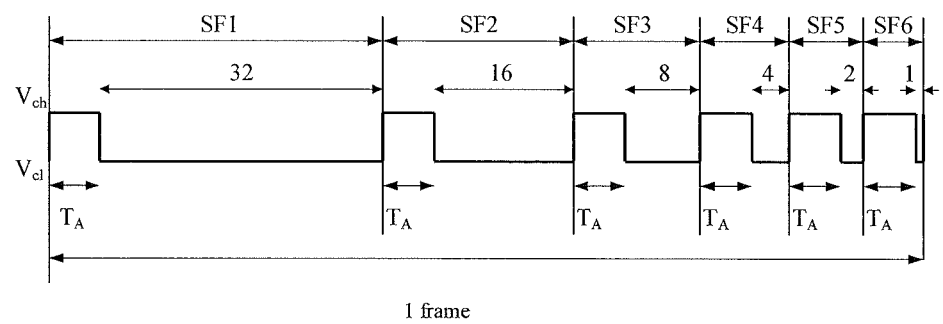
SF1-SF6: sub-frame, $T_A$: write in time
FIG. 18C

ORGANIC LIGHT EMITTING ELEMENT AND DISPLAY DEVICE USING THE ELEMENT

CROSS-REFERENCE TO RELATED APPLICATIONS

This application is a continuation of U.S. application Ser. No. 14/188,741, filed Feb. 25, 2014, now allowed, which is a continuation of U.S. application Ser. No. 13/444,889, filed Apr. 12, 2012, now U.S. Pat. No. 8,674,348, which is a is a continuation of U.S. application Ser. No. 12/978,678, filed Dec. 27, 2010, now U.S. Pat. No. 8,174,007, which is a continuation of U.S. application Ser. No. 12/325,790, filed Dec. 1, 2008, now U.S. Pat. No. 7,858,977, which is a continuation of U.S. application Ser. No. 11/564,971, filed Nov. 30, 2006, now U.S. Pat. No. 7,459,722, which is a divisional of U.S. application Ser. No. 10/060,427, filed Jan. 29, 2002, now U.S. Pat. No. 7,173,370, which claims the benefit of a foreign priority application filed in Japan as Ser. No. 2001-025971 on Feb. 1, 2001, all of which are incorporated by reference.

BACKGROUND OF THE INVENTION

1. Field of the Invention

The present invention relates to an organic light emitting element which has an anode, a cathode and a film comprising an organic compound in which light emission is obtained by applying an electric field (hereinafter referred to as organic compound film), and to a display device using the organic light emitting element. The present invention particularly relates to a display device including organic light emitting elements for emitting light of respective colors of red, green and blue as pixels, in which emission efficiency of the element for emitting red color light is high and also, the element life is long. Note that the display device in this specification indicates an image display device using an organic light emitting element as a light emitting element. Further, a module in which an organic light emitting element is attached to a connector, for example, an anisotropic conductive film (FPC: flexible printed circuit), a TAB (tape automated bonding) tape or a TCP (tape carrier package), a module in which a printed wiring board is provided at an end of the TAB tape or TCP, and a module in which an organic light emitting element is directly mounted with an IC (integrated circuit) by a COG (chip on glass) method, all are included in the display devices.

2. Description of the Related Art

An organic light emitting element is an element that emits light by applying an electric field. The light emission mechanism is described as follows. A voltage is applied to electrodes sandwiching an organic compound film, whereby an electron injected from a cathode and a hole injected from an anode recombine in the organic compound film to form a molecule in an excitation state (molecular exciton). Then, the molecular exciton releases energy in returning to a base state, to emit light.

In such an organic light emitting element, in general, the organic compound film is formed as a thin film with a thickness of less than 1 μm. Further, the organic light emitting element is a self light emitting element in which the organic compound film itself emits light, and thus does not need a backlight that is used in a conventional liquid crystal display. Therefore, it is a great advantage that the organic light emitting element can be extremely made thin and lightweight.

Further, for example, in the organic compound film with a thickness of approximately 100 to 200 nm, the time from carrier injection to carrier recombination is approximately several tens of nanoseconds with taking into consideration the carrier mobility of the organic compound film. Light emission is reached within microsecond even if the process from carrier recombination through light emission is considered. Therefore, it is one of strong points that a response speed is very high.

Furthermore, the organic light emitting element is a carrier injection type light emitting element. Thus, driving with a direct voltage is possible, and noise is hard to be occurred. As regards a driving voltage, there is the following report; first, the organic compound film is formed to be uniform and very thin with a thickness of approximately 100 nm; further, an electrode material which makes small a carrier injection barrier to the organic compound film, is selected; in addition, a hetero structure (here, two-layer structure) is introduced: thus a sufficient brightness of 100 $cd/m^2$ is realized at 5.5 V. (Reference 1: C. W. Tang and S. A. VanSlyke, "Organic electroluminescent diodes," Applied Physics Letters, vol. 51, No. 12, 913-915 (1987))

Besides the above-described element characteristics such as thinness and lightness, high-speed respondence and direct low voltage drive, it is one of great advantages that the organic light emitting element has a large variety of emission colors. A factor for this advantage is the variety of the organic compound itself. That is, the flexibility that materials for various emission colors can be developed by molecule design (for example, introduction of a substituent) and the like leads to richness in colors.

The most applied field of the organic light emitting element which utilizes the richness in colors can be said to be a full-color flat panel display. The reason for this is that, full color can be easily attained by patterning the organic materials since there are a large number of organic materials capable of emitting the three primary colors of light of red, green and blue. The element characteristics such as thinness and lightness, high-speed respondence and direct low voltage drive as described above can be regarded as the characteristics suitable for the flat panel display.

By the way, white color can be obtained by emitting light of all the respective colors of red, green and blue. The balance of the three primary colors of light needs to be considered in emitting white color light. Thus, minimum required efficiency (here, power efficiency, the unit is 1 m/W) with respect to each color is shown (Reference 2: Yoshiharu Sato. "Applied Physics Society Organic Molecules—Bio-electronics Section," Vol. 11. No. 1. P. 88 (2000)).

According to Reference 2, it is seen that there are a large number of reports in which a required value is exceeded as to green color and blue color while a value for red color falls far short of a required value. Therefore, the improvement in emission efficiency of red color is an essential element for developing of the full-color flat panel display. Then, the improvement in the emission efficiency enables reduction in power consumption.

It is given that a fluorescent material are used not only for a light emitting material for red color but also for a general organic light emitting element as one of factors in low emission efficiency. In the organic light emitting element, light emission is occurred when a molecular exciton returns to a ground state. The light emission from a singlet excitation state (S*) (fluorescence) and the light emission from a triplet excitation state (T*.) (phosphorescence) are possible as the light emission. Only the light emission from S* fluorescence) makes a contribution in the case where the fluorescent material is used.

However, a statistical generation ratio of S* to T* in the organic light emitting element is considered to be S*:T*=1:3 (Reference 3: Tetsuo Tsutsui. "Applied Physics Society Organic Molecules—Bio-electronics Section—Text of the Third Lecture Meeting." P. 31 (1993)). Therefore, the theoretical limit of internal quantum efficiency (ratio of generated photons to injected carriers) in the organic light emitting element using the fluorescent material is established as 25% on the basis of S*:T*=1:3. In other words, in case of the organic light emitting element using the fluorescent material, at least 75% of injected carriers are wasted.

On the contrary, it is considered that the emission efficiency is improved (simply, three to four times) if the light emission from T*, that is, phosphorescence can be utilized. However, in a general organic compound, the light emission from T* (phosphorescence) is not observed at a room temperature, and only the light emission from S* (fluorescence) is generally observed. The reason for this is that, since the base state of the organic compound is generally a singlet ground state ($S_o$), $T^*$ -$S_o$ transition is forbidden transition while $S^*$-$S_o$ transition is allowed transition.

However, the presentations on an organic light emitting element capable of converting energy released in returning to a ground state from T* (hereinafter referred to as "triplet excitation energy") into light emission have been given one after another in recent years, and the highness of the emission efficiency has attracted attention. (Reference 4: D. F. O'Brien, M. A. Baldo, M. E. Thompson and S. R. Forrest, "Improved energy transfer in electrophosphorescent devices," Applied Physics Letters, vol. 74, No. 3. 442-444 (1999)). (Reference 5: Tetsuo Tsutsui, Moon-Jae Yang, Masayuki Yahiro, Kenji Nakamura, Teruichi Watanabe, Taishi Tsuji, Yoshinori Fukuda, Takeo Wakimoco and Satoshi Mivaguchi. "High Quantum Efficiency in Organic Light-Emitting Devices with Iridium-Complex as a Triplet Emissive Center," Japanese Journal of Applied Physics, Vol. 38, L1502-L1504 (1999))

A metal complex with platinum as central metal (hereinafter referred to as "platinum complex") and a metal complex with iridium as central metal (hereinafter referred to as "iridium complex") are used as light emitting materials in Reference 4 and Reference 5, respectively. It can be said that these metal complexes have such a feature that a third transition series element is introduced as the central metals. Both of the complexes are materials capable of converting triplet excitation into light emission at a room temperature (hereinafter referred to as "triplet light emitting material").

As shown in Reference 4 and Reference 5, an organic light emitting element capable of converting triplet excitation energy into light emission can attain a higher internal quantum efficiency in comparison with prior art. Then, as the internal quantum efficiency becomes higher, the emission efficiency (1 m/W) is improved. Therefore, if the light emitting element for red color is manufactured by using the organic light emitting element capable of converting triplet excitation energy into light emission (hereinafter referred to as "triplet tight emitting element"), the emission efficiency of the red color light emitting element can be improved.

From the above, an organic light emitting element that presents the light emission from a singlet excitation state (hereinafter referred to as "singlet light emitting element") is used for green color and blue color while the triplet light emitting element is applied for red color, whereby the full-color flat panel display with sufficiently high brightness and low power consumption, in which the balance of the three primary colors of light is considered, is expected to be manufactured.

However, according to the report of Reference 5, the half-life of the brightness in constant current drive is approximately 170 hours when the initial brightness is set to 500 cd, $m^2$, and thus, the triplet light emitting element has a problem on an element life. On the other hand, in case of the singlet light emitting element, the half-life of the brightness at constant current drive is several thousands of hours to ten thousands hours when the initial brightness is set at 500 $cd/m^2$. Thus, it can be said that the singlet light emitting element reaches the practical stage in terms of an element life.

Therefore, in prior art, when the singlet light emitting element is used for Green color and blue color while the triplet light emitting element is applied for red color to thereby manufacture the full-color flat panel display, a change of brightness in time largely differs between a pixel for green color or blue color and a pixel for red color.

Namely, this indicates that the balance of the three primary colors of light is greatly lost with the lapse of time (after several hundred of hours), and along with this, the power consumption in of light emission of red color increases. Therefore, it can be said that an extremely important technical object is to lengthen the life of the triplet light emitting element, particularly, the life of the triplet light emitting element for red color.

SUMMARY OF THE INVENTION

The present invention has been made in view of the above, and an object of the present invention is therefore to suppress reduction in brightness of a triplet light emitting element for red color and to lengthen a life of the element, and another object of the present invention is to provide an organic light emitting element for red color with higher light emission efficiency and a longer life.

Further, still another object of the present invention is to provide a display device, in which a balance of three primary colors of light is more favorable, besides, power consumption is lower, and a change of fluctuation among colors with time is smaller than prior art, by using the triplet light emitting element for red color and singlet light emitting elements for green color and blue color. Furthermore, yet still another object of the present invention is to provide an electric device with lower power consumption than prior art and a display portion exhibiting a clear display that never fades even with the lapse of time, by using, the display device.

Regardless of the difference between the singlet light emitting element and the triplet light emitting element, an organic light emitting element generally has a characteristic that a lamination structure (hetero structure) as shown in Reference 1 is formed. In Reference 1, for example, a single hetero structure, in which a hole transporting layer composed of an aromatic diamine compound and an electron transporting light emitting layer composed of tris (8-quinolinolate)-aluminum (hereinafter referred to as "$Alq_3$") are laminated, is applied to an organic compound film, whereby carrier recombination efficiency is enhanced steeply. This is described as follows.

For example, in case of the organic light emitting element only including an $Alq_3$ single layer, most of electrons injected from a cathode do not recombine with holes and reach an anode since $Alq_3$ has electron transporting property. Thus, the emission efficiency is extremely low. That is, it is necessary to use a material capable of transporting both of the electrons and the holes with keeping stable balance (hereinafter referred to as "bipolar material") in order to make the organic light emitting element with a single layer emit light with efficiency (or to drive at a low voltage). $Alq_3$ does not meet the requirement.

However, when the single hetero structure shown in Reference 1 is applied, the electrons injected from the cathode are blocked at an interface of the hole transporting layer and the electron transporting light emitting layer, and are sealed in the electron transporting light emitting layer. Therefore, carrier recombination is performed in the electron transporting light emitting layer with efficiency to lead to light emission with efficiency. That is, a blocking function of the carrier due to the introduction of the hetero structure is the core of a technique.

Further, in the organic light emitting element in Reference 1, separation of functions is realized, that is, the hole transporting layer conducts transportation of holes and the electron transporting light emitting layer conducts transportation of electrons and light emission. The advantage of such function separation is that one kind of organic material does not need to simultaneously have various functions (light emitting property, carrier transporting property, carrier injecting property from an electrode, and the like) by realizing the function separation, and thus, molecule design and the like can have a wide degree of freedom (For example, it is not necessary to forcedly look for the bipolar material). That is, a material with a satisfactory light emitting characteristic, a material with an excellent carrier transporting property and the like are combined one another, whereby high emission efficiency can be easily achieved.

However, the lamination structure as described above is the junction of different substances. Thus, an interface (hereinafter referred to as "organic interface") is occurred between respective layers. The influence on the life of the organic light emitting element is considered as the problem that derives from the formation of the organic interface. That is, the carrier movement is disturbed at the organic interface, and the brightness is lowered due to accumulation of charge.

Although no definite theory has been established regarding the mechanism of this degradation, it has been reported that the reduction in brightness can be suppressed by inserting a hole injecting layer between the anode and the hole transporting layer, and in addition, by performing ac drive at a rectangular wave instead of dc drive (Reference 5: S. A. VanSlyke. C. H. Chen, and C. W. Tang, "Organic electroluminescent devices with improved stability." Applied Physics Letters. Vol. 69. No. 15, 2160-2162 (1996). This can be sold to be experimental evidence that the reduction in brightness can be suppressed in accordance with eliminating charge accumulation by adding the hole injecting layer and by using the ac drive.

Here, the element structure of the triplet light emitting element for red color shown in Reference 4 is shown in FIG. 1. In FIG. 1, 4,4'-bis[N-(1-naphthyl)-N-phenyl-amino]-biphenyl (hereinafter referred to as α-NPD) is used for a hole transporting layer, 4,4'-dicarbazole-biphenyl (hereinafter referred to as "CBP") is used as a host material of a light emitting layer. 2, 3, 7, 8, 12, 13, 17, 18-octaethyl-21H, 23H-porphyrin-platinum (hereinafter referred to as "PtOEP") is used for a triplet light emitting material, basocuproin (hereinafter referred to as "BCP") is used for a blocking layer. $Alq_3$ is used for an electron transporting layer, and Mg:Ag alloy is used for a cathode.

The triplet light emitting element generally needs the host material appropriate for the light emitting material (in FIG. 1. CBP) and a blocking material for preventing diffusion of molecular excitons (in FIG. 1. BCP), and thus, takes the multilayer structure as shown in FIG. 1. Thus, a large number of organic interfaces are generated. Therefore, it is considered that this is a factor for the short life of the triplet light emitting element.

In order to overcome the above problem, it is important to consider the reason that the carrier movement is disturbed at the organic interface and to improve it. Then, the present inventor first thought of two mechanisms described below as models in which the carrier movement is disturbed due to the formation of the organic interface.

First, as one of the mechanisms, a mechanism that derives from morphology of the organic interface may be given. The organic compound film in the organic light emitting element is generally a film in an amorphous state, and is formed by cohering molecules of the organic compound with each other with a force among the molecules mainly composed of dipole interaction. However, if the hetero structure is formed by using an aggregate of the molecules, there is a possibility that the difference among the molecules in size and shape greatly influences the interface of the hetero structure (that is, the organic interface).

In particular, in the case forming the hetero structure by using materials in which molecules greatly differ one another in size, it is considered that the conformity of the junction in the organic interface is deteriorated. The conceptual diagram is shown in FIG. 2. In FIG. 2, a first layer 211 consisting of small molecules 201 and a second layer 212 consisting of large molecules 202 are laminated. In this case, regions 214 with poor conformity are occurred at a formed organic interface 213.

The regions 214 with poor conformity shown in FIG. 2 may become barriers which disturb the carrier movement (or energy barriers), and thus, it is suggested that the regions 214 become an obstacle for further reduction in a driving voltage. Further, there is a possibility that the carrier that cannot go over the energy barrier is accumulated as charge, which invites the reduction in brightness as described above.

As another mechanism, a mechanism that derives from the process of forming the lamination structure (that is, forming the organic interface) can be given. The organic light emitting element with the lamination structure is generally manufactured by using a multi-chamber type (in-line type) evaporation apparatus shown in FIG. 3 in order to avoid contamination in the formation of the respective layers from the viewpoint of blocking of the carrier and function separation.

FIG. 3 is a conceptual diagram of an evaporation apparatus for forming a three-layer structure (double hetero structure) of a hole transporting layer, a light emitting layer and an electron transporting layer. First, a substrate having an anode (indium-tin oxide (hereinafter referred to as "ITO") or the like) is carried into a loading chamber, and then, is irradiated with ultraviolet rays in a vacuum atmosphere in an ultraviolet ray irradiation chamber, whereby the surface of the anode is cleaned. Particularly in the case where the anode is oxide such as ITO, an oxidization process is performed in a pretreatment chamber. Further, in order to form the respective layers of the lamination structure, the hole transporting layer is formed in an evaporation chamber 301, the light emitting layers are formed in evaporation chambers 302 to 304 (in FIG. 3, three colors of red, green and blue), the electron transporting layer is formed in an evaporation chamber 305, and a cathode is formed by evaporation in an evaporation chamber 306. Finally, sealing is conducted in a sealing chamber, and then, the substrate is carried out from an unloading chamber. Thus, an organic light emitting element is obtained.

The characteristic of such an in-line type evaporation device is that the respective layers are formed by evaporation in the different evaporation chambers 301 to 305. That is, the device has a structure that materials for the respective layers are hardly mixed with each other.

By the way, although the inside of the evaporation device is generally decompressed to approximately $10^{-4}$ to $10^{-5}$ pascal, a very small amount of gas components (oxygen, moisture and the like) exists. Then, in case of the degree of vacuum as described above, it is said that even the very small amount of gas components easily forms an absorption layer of approximately a monolayer only in several seconds.

In the case of manufacturing the organic light emitting element with the lamination structure by using the device in FIG. 3, it is a problem that a large interval is generated between the formation of the respective layers. That is, there is a fear that the absorption layer composed of the very small amount of gas components (hereinafter referred to as "impurity layer") is formed in the interval between the formation of the respective layers, particularly in transferring the substrate through a second transfer chamber.

The impurity layer formed between the respective layers (that is, on the organic interface) becomes an impurity region that traps the carrier to interfere with the carrier movement after the completion of the organic light emitting element. Thus, the impurity layer also causes a driving voltage to rise. Further, when the impurity region that traps the carrier exists, charge is accumulated in the region. Thus, there is a possibility that the above-described reduction in brightness is invited.

Taking the above-described mechanisms into consideration, it is required that the conventional lamination structure element is superseded by new one in terms of both an element structure and a manufacturing process in order to overcome the problem on the organic interface (deterioration of morphology of the organic interface and formation of the impurity layer).

In addition, in case of the triplet light emitting element, there is a limitation that function separation should be realized as the case of the lamination structure element. The reason for this is that a light emitting region in which doping is conducted to a proper host material needs to be provided since the triplet light emitting material has poor carrier transporting property and has to be used as dopant. Further, since a diffusion length of a triplet molecular exciton is longer than that of a singlet molecular exciton, a blocking material for preventing diffusion of the molecular excitons is also required. That is, even if the organic interface is removed, the triplet light emitting element does not reach the light emission with efficiency without the function separation of the organic compound film.

Taking the above into consideration, the present inventor devised a technique for realizing a triplet light emitting element in which an organic interface is removed and function separation is realized in an organic compound film. The conceptual diagrams are shown in FIGS. 4A and 4B and FIG. 5.

In FIG. 4A, in an organic compound film 403, a hole transporting region 405 composed of a hole transporting material, an electron transporting region 406 composed of an electron transporting material and a mixed region 407 in which the hole transporting material and the electron transporting material are mixed are provided. Further, a triplet light emitting material 408 is doped in the mixed region 407. Here, although an anode 402 is provided on a substrate 401, the inverse structure may be taken in which a cathode 404 may be provided on the substrate.

In the case of forming such an element, the hole transporting material can receive and transport holes at the anode side while the electron transporting material can receive and transport electrons at the cathode side. Further, since the mixed region 407 has bipolar property, both the holes and the electrons can move in the mixed region 407. Thus, carriers recombine in the mixed region 407 leads to light emission. However, in this case, it is preferable that the energy difference between a highest occupied molecular orbital (HOMO) and a lowest unoccupied molecular orbital (LUMO) (hereinafter referred to as "excitation energy level") of the triplet light emitting material is small in comparison with the hole transporting material and the electron transporting material from the viewpoint that the diffusion of the triplet molecular excitons is prevented.

Further, in the element shown in FIG. 4A, the regions in which respective functions can be expressed exist in the organic compound film 403. The expression of the functions is realized, and besides, the organic interface which is seen in the conventional lamination structure does not exist. Therefore, the problem that derives from the above-described organic interface (deterioration of the morphology of the organic interface and formation of the impurity layer) can be solved.

First, the solution for the deterioration of the morphology of the organic interface will be explained with reference to FIG. 6. FIG. 6 shows an organic light emitting element disclosed in the present invention, which is constituted of a region 611 consisting small molecules 601, a region 612 consisting of large molecules 602 and a mixed region 613 including both the small molecules 601 and the large molecules 602. As apparent from FIG. 6, the organic interface, 213 which exists in FIG. 2, does not exist, and the region 214 with poor conformity does not exist, either.

Further, the solution for the formation of the impurity layer is simple and clear. In the case of forming the organic light emitting element in FIGS. 4A and 4B, it is favorable to conduct the process as follows. The hole transporting material is evaporated on the anode, the electron transporting material is started to evaporate thereon on the midway in the form of co-evaporation to form the mixed region, the evaporation of the hole transporting material is stopped after the formation of the mixed region, and then, the electron transporting material is evaporated. Therefore, the interval as shown in FIG. 2 does not exist, which is generated when the organic light emitting element is manufactured by using the evaporation device. That is, the time for forming the impurity layer does not exist.

As described above, in the triplet light emitting element of the present invention, the carrier movement is smooth since the organic interface is not formed. Thus, the element life is not adversely affected. Further, the function separation is realized as in the lamination structure, and thus, there is no problem on emission efficiency, either.

Note that, in FIG. 4A, a hole injecting region composed of a material for enhancing hole injecting property (hereinafter referred to as "hole injecting material") may be inserted between the anode and the organic compound film. Further, an electron injecting region composed of a material for enhancing electron injecting property (hereinafter referred to as "electron injecting material") may be inserted between the cathode and the organic compound film. Furthermore, both the hole injecting region and the electron injecting region may be inserted.

In this case, the hole injecting material or the electron injecting material is a material for making small the barrier for carrier injection from the electrode to the organic compound film, and thus has an effect that the carrier movement from the electrode to the organic compound film is smoothened and the accumulation of charge is removed. However, it is preferable that the respective injecting materials and the organic compound film are deposited without putting an interval therebetween from the viewpoint as described above that the formation of the impurity layer is avoided.

Further, the light emitting region is kept distant from both the electrodes as much as possible, whereby quenching due to the energy movement to the electrode material can be prevented. Therefore, in the organic light emitting element as shown in FIG. 4A, the region to which the triplet light emitting material is doped may not be the entire region of the mixed region 407 but a part of the region (especially, the center portion).

Furthermore, as shown in FIG. 4B, it is preferable that, besides the triplet light emitting material 408, a blocking material 409 is doped to the mixed region 407. The blocking material 409 is a material with a function of blocking a carrier or a molecular exciton, and preferably has the largest excitation energy level among the materials contained in the mixed region 407. The doping of the blocking material 409 enables the improvement in a carrier recombination rate in the mixed region 407 and the prevention of the diffusion of the molecular excitons. Thus, it is considered that the emission efficiency is improved.

Note that the blocking material 409 may be doped over the mixed region 407. However, the blocking material generally has a function of blocking one of a hole and an electron in many cases, and thus, the carrier balance in the mixed region may be lost if the doping is conducted to the entire mixed region. Therefore, the region to which the blocking material is doped may not be the entire mixed region but a part of the region (especially, the end portion).

In particular, in the case where the blocking material 409 has hole blocking property, the hole blocking material is doped to the area closer to the cathode side than the region to which the triplet light emitting material 408 is doped as shown in FIG. 4B, whereby light emission is obtained with efficiency.

By the way, it is preferable that a concentration gradient is formed in the mixed region containing both the hole transporting material and the electron transporting material, so that the concentration of the hole transporting material gradually decreases while the concentration of the electron transporting material gradually increases in the direction from the anode toward the cathode from the viewpoint of control of the carrier balance. Further, in the present invention, the mixed region is also a carrier recombination region. Thus, it is desirable that the mixed region has a thickness of 10 nm or more.

By the way, the organic interface is removed, and besides, the functions are exhibited with the element structure in which the triplet light emitting material is doped into the mixed region composed of the hole transporting material and the electron transporting material so far. In addition, it is an effective means that the mixed region is provided in the organic interface in the Lamination structure on the basis of the conventional lamination structure in FIG. 1. The conceptual diagram is shown in FIG. 5.

FIG. 5 shows an organic light emitting element, in which an anode 502, a hole injecting region 503 composed of a hole injecting material, a hole transporting region 504 composed of a hole transporting material, a light emitting region 505 including a host material to which a triplet light emitting material is doped, a blocking region 506 composed of a blocking material, an electron transporting region 507 composed of an electron transporting material, an electron injecting region 508 composed of an electron injecting material and a cathode 509, are provided on a substrate 501. All the regions 503 to 508 do not need to be used in the present invention, and it is sufficient that at least the regions 504 to 507 exist. However, all the regions are shown for the sake of convenience. Note that the anode 502 is provided on the substrate 501 here, but the inverse structure may be taken in which the cathode 509 is provided on the substrate.

At this time, a characteristic of the present invention is that respective materials used for upper and lower regions in the space concerned (for example, the hole transporting material and the host material in case of a space 512) are mixed in any one of spaces 511 to 515 each between the respective regions. In other words, although the spaces 511 to 515 each between the respective regions are shown by broken lines in FIG. 5, no organic interface actually exists. It can be said that mixed regions are provided.

In the triplet light emitting element as well, the carrier movement is smooth since the organic interface is not formed. Thus, the element life is not adversely affected. Further, the function separation is realized as in the lamination structure, and thus, there is no problem on emission efficiency, either.

As described above, while the conventional lamination structure is the simple junction (hetero-junction) of different substances, the structures of the present invention, which are exemplified in FIGS. 4A and 4B and FIG. 5, are, as it were, mixed-junctions. Thus, it can be said that the organic light emitting elements shown in FIGS. 4A and 4B and FIG. 5 are organic light emitting elements based on the new concept.

Further, the triplet tight emitting material for red color is used for the triplet light emitting element based on the concept shown in FIGS. 4A and 4B and FIG. 5, whereby an organic light emitting element for red color can be provided in which emission efficiency is higher and a life is longer than prior art. Further, a display device can be manufactured in which a balance of the three primary colors of light is more favorable, besides, power consumption is lower, and a change of color fluctuation with time is smaller than prior art, by using the triplet light emitting element for red color and singlet light emitting elements for green color and blue color.

Furthermore, in the above-described display device, it is preferable that the mixed junction as disclosed in the present invention is implemented in the singlet light emitting elements for green color and blue color, not the conventional lamination structure. That is, it is favorable that the triplet light emitting material to be doped is substituted with the singlet light emitting material for green color or blue color, or that a carrier transporting material is made to emit light without doping (or a material for emitting light of green color or blue color is selected) in FIGS. 4A and 4B or FIG. 5.

BRIEF DESCRIPTION OF THE DRAWINGS

In the accompanying drawings:

FIGS. 9A to 9E show a procedure of forming a display device;

FIGS. 18A to 18C show structures of a display device;

DETAILED DESCRIPTION OF THE PREFERRED EMBODIMENTS

Hereinafter, an embodiment mode in implementing the present invention will be described. Note that, in an organic light emitting element. It is sufficient that at least one of an anode and a cathode is transparent in order to obtain light emission. In the present embodiment mode, description is made on the basis of an element structure in which a transparent anode is formed on a substrate to take out light from the anode. In actuality, it is also possible to apply the present invention to a structure in which a transparent cathode is formed on a substrate to take out light from the cathode and a structure in which light is taken out from the opposite side to a substrate.

In implementing the present invention, a manufacturing process of the organic light emitting element is important in order to prevent the formation of an impurity layer. Then, first, a method of manufacturing a triplet light emitting element having a mixed region, which is disclosed in the present invention, is described while focused on the formation of the mixed region.

Figure 7A:
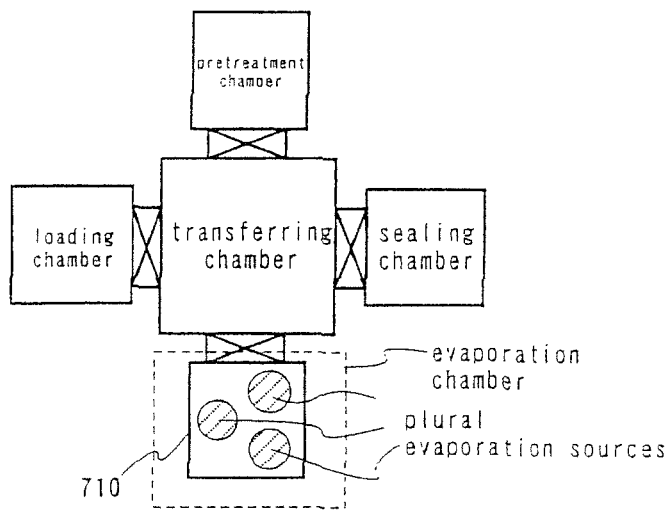
FIGS. 7A and 7B show structures of an evaporation device.

FIG. 7A is a top view of an evaporation device. The evaporation device is of a single chamber type in which one vacuum tank 710 is arranged as an evaporation chamber, and a plurality of evaporation sources are provided in the vacuum tank. Then, various materials having different functions such as a hole injecting material, a hole transporting material, an electron transporting material, an electron injecting material, a blocking material, a light emitting material, and a constituent material for a cathode are separately provided in the plurality of evaporation sources, respectively.

In the evaporation device having the evaporation chamber as described above, first, a substrate having an anode (ITO or the like) is carried into a loading chamber. In the case where the anode is oxide such as ITO, an oxidization process is conducted in a pretreatment chamber (Note that, although not shown in FIG. 7A, it is also possible to provide an ultraviolet ray irradiation chamber in order to clean the surface of the anode). Further, all the materials for forming the organic light emitting element are evaporated in the vacuum tank 710. However, a cathode may be formed in the vacuum tank 710, or another evaporation chamber may be provided to form the cathode therein. In short, it is favorable that evaporation is conducted in the vacuum tank 710 up through the formation of the cathode. Finally, sealing is conducted in a sealing chamber, and the substrate is carried out from an unloading chamber to obtain an organic light emitting element.

Figure 7B:
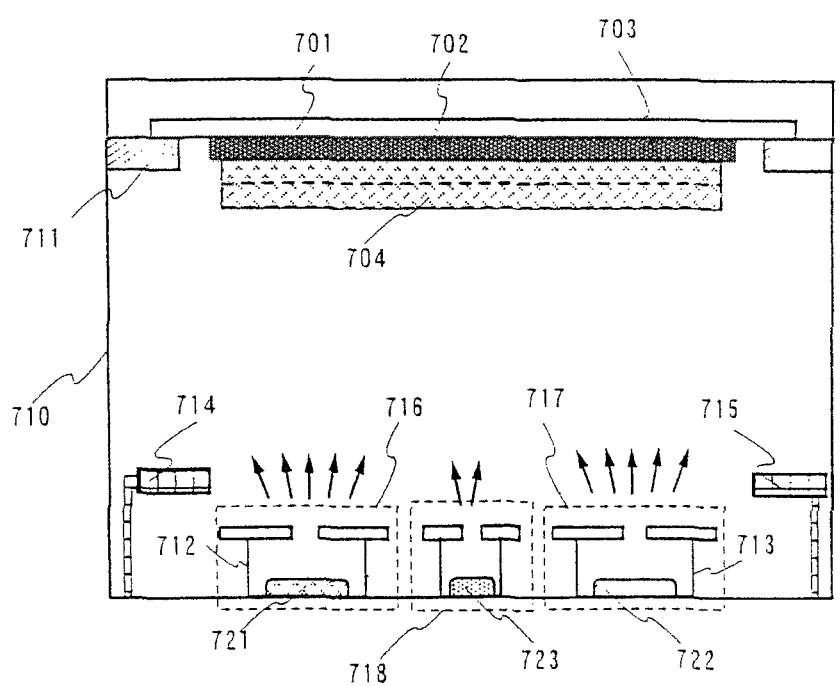

The procedure of manufacturing the triplet light emitting element according to the present invention using such a single chamber type evaporation device is described with reference to FIG. 7B (cross sectional view of the vacuum tank 710). FIG. 7B shows a process of forming an organic compound film constituted of a hole transporting material 721, an electron transporting material 722, and a triplet light emitting material 723 by using the vacuum tank 710 which has the three evaporation sources (an organic compound evaporation source a 716, an organic compound evaporation source b 717, and an organic compound evaporation source c 718) as the most simple example.

First, a substrate 701 having an anode 702 is carried into the vacuum tank 710, and is fixed by a fixing table 711 (the substrate is generally made to rotate at the time of evaporation). Next, the inside of the vacuum tank 710 is decompressed ($10^{-4}$ pascal or less is preferable), and then, a container a 712 is heated to vaporize the hole transporting material 721. After a predetermined evaporation rate (unit: Å/s) is obtained, a shutter a 714 is opened to thereby start evaporation. At this time, a container b 713 is also heated with shutter b 715 closed.

Thereafter, the shutter b 715 is opened with the shutter a 714 opened, and thus the electron transporting material 722 is co-evaporated to form a mixed region 704 after the formation of a hole transporting region 703. Accordingly, an impurity layer is not mixed between the hole transporting region 703 and the mixed region 704. Note that a very small amount of the triplet light emitting material 723 is also doped upon the formation of the mixed region 704 (the state shown in FIG. 7B).

Further, in order to form an electron transporting region, the shutter a 714 is closed with the shutter b 715, and heating of the container a 712 is finished. Accordingly, an impurity layer is not formed between the mixed region 704 and the electron transporting region.

Note that, in the case where a hole injecting region or an electron injecting region is formed, evaporation sources for respective injecting materials may be provided in the same vacuum tank 710. In FIG. 7B, for example, in the case where the hole injecting region is provided between the anode 702 and the hole transporting region 703, the hole transporting material 721 is vaporized without putting an interval after the hole injecting material is evaporated onto the anode 702. Thus, the formation of the impurity layer can be avoided.

Figure 5:
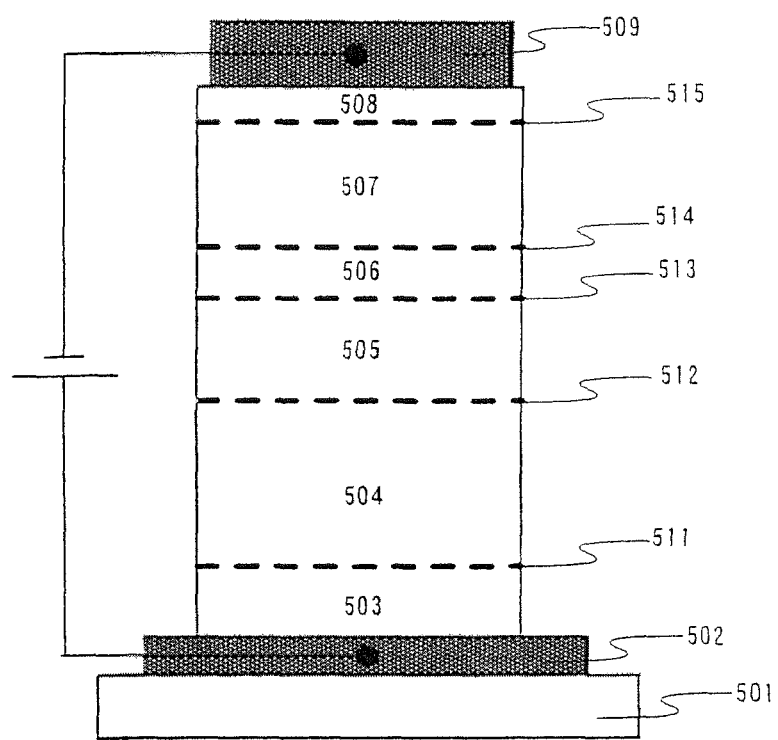
FIG. 5 shows a structure of an organic light emitting element.
Figure 6:
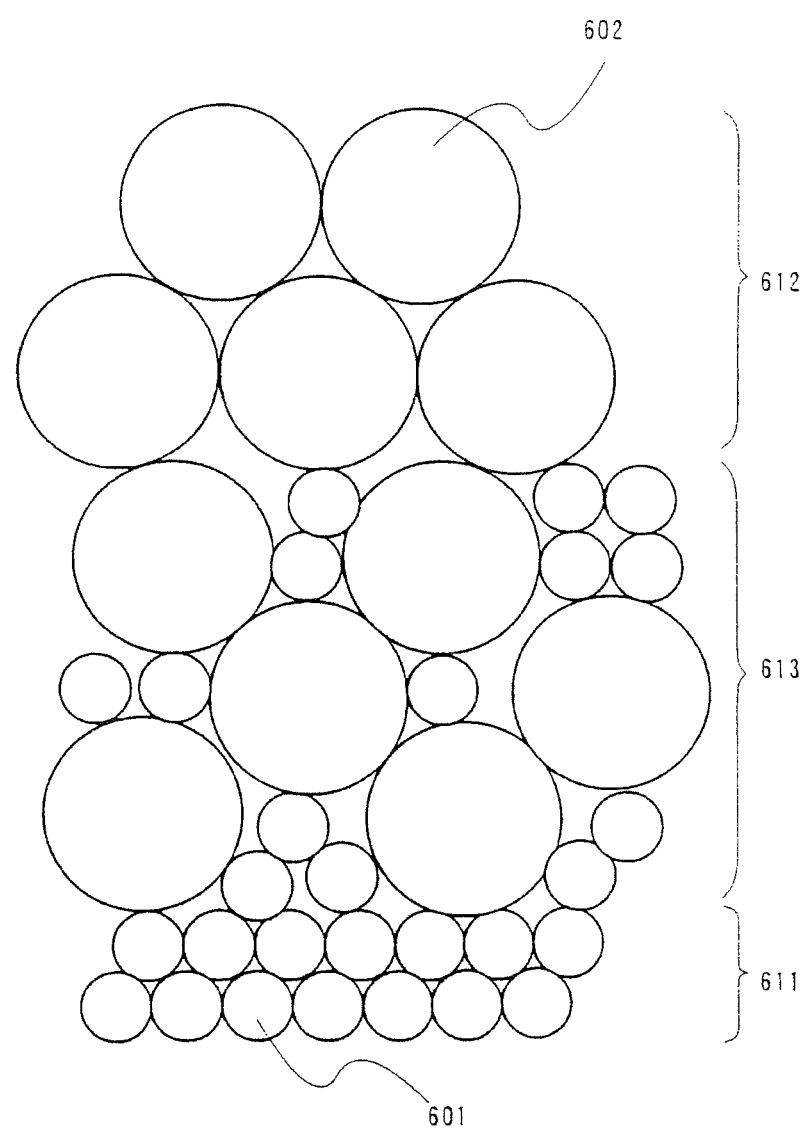
FIG. 6 shows a state of an organic compound film.

If the above-described method is applied, it is possible to manufacture all the organic light emitting elements described in "summary of the invention." For example, even in the case where the mixed regions are provided between the respective regions as shown in FIG. 5, it is possible to utilize the similar co-evaporation. In this case as well, the formation of the impurity layer can be avoided since the interval does not exist. Further, the organic light emitting elements can be manufactured by a similar technique also in the case where the mixed regions are provided in a singlet light emitting element.

Figure 1:
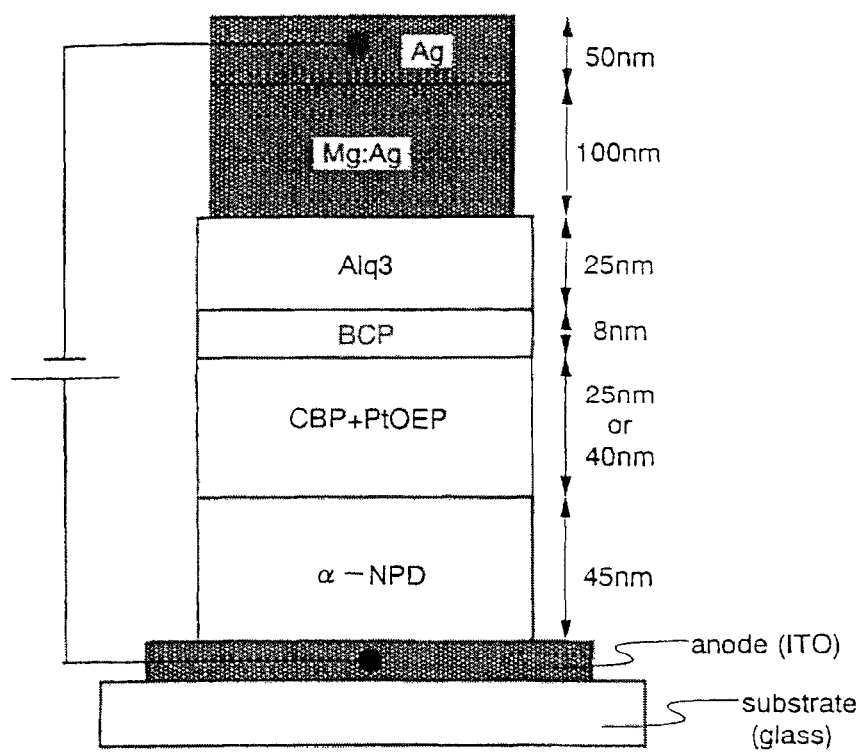
FIG. 1 shows a structure of a conventional organic light emitting element.
Figure 2:
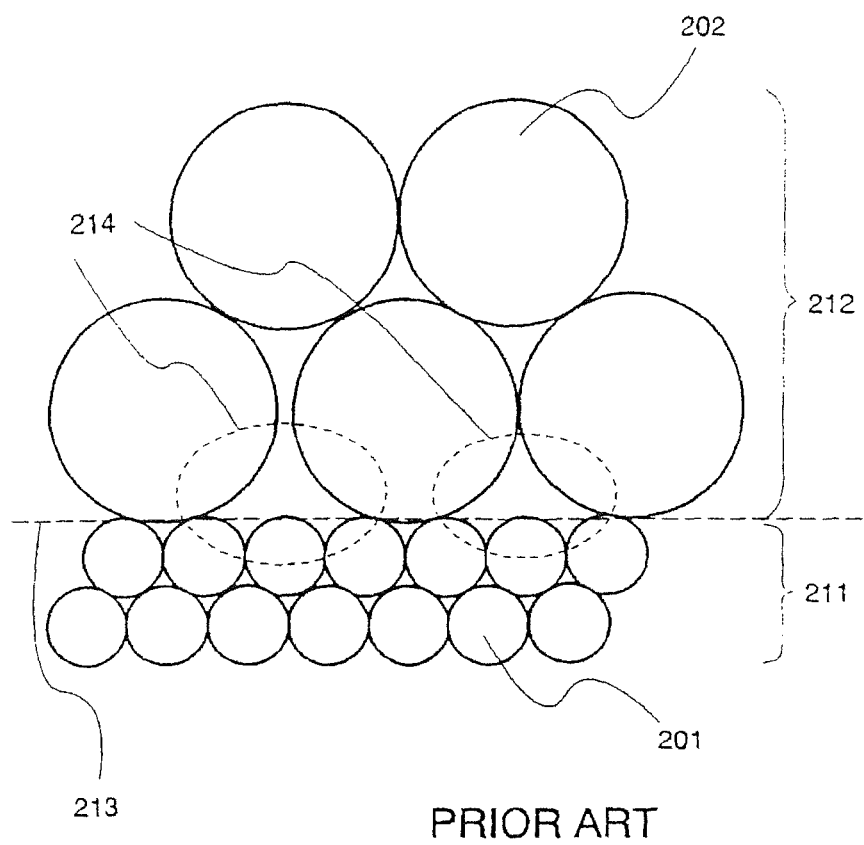
FIG. 2 shows a state of an organic compound film.
Figure 3:
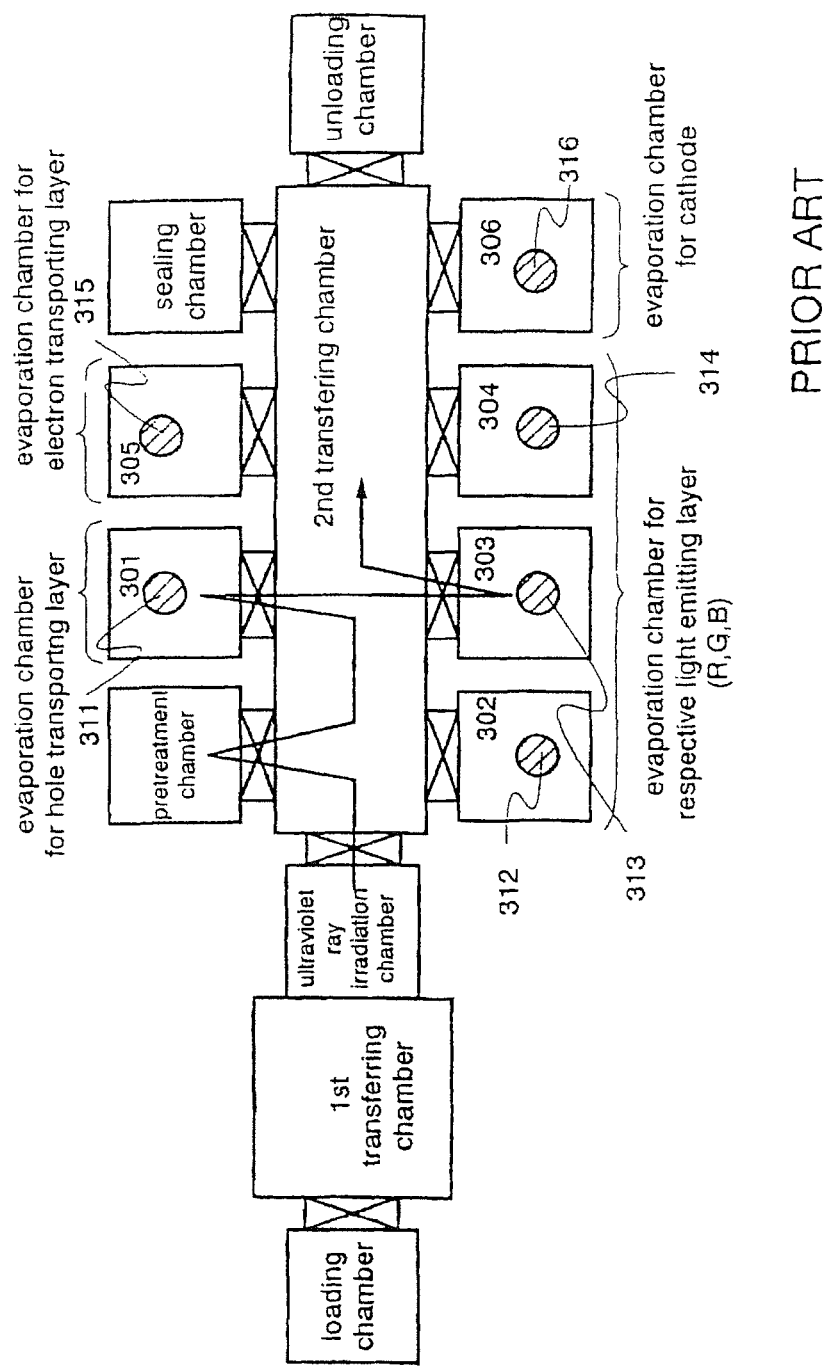
FIG. 3 shows a structure of an evaporation device.
Figure 8:
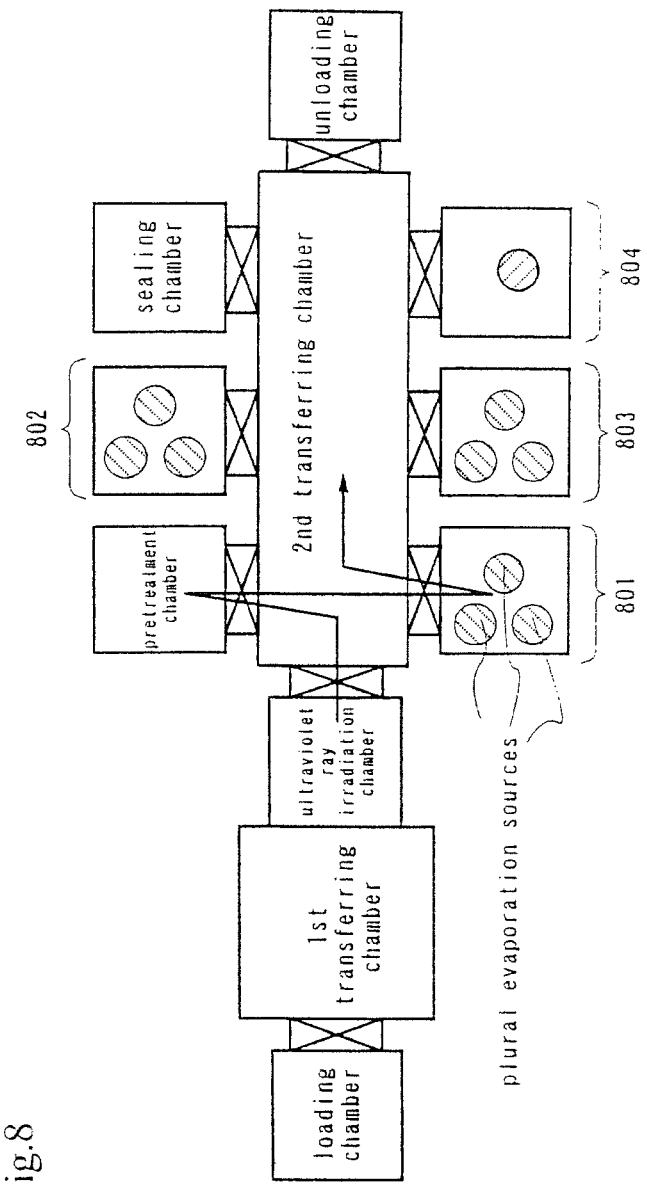
FIG. 8 shows a structure of an evaporation device.

Next, an evaporation procedure for each pixel in manufacturing a display device is shown in schematic diagrams of FIG. 8 and FIGS. 9A to 9E. FIG. 8 shows an example of an evaporation device with which the display device can be manufactured. The evaporation device seems similar to that shown in FIG. 3 at first glance, but there is a greatly different point between them. Differently from the evaporation device shown in FIG. 3 in which the separate evaporation chambers are provided for the respective layers (that is, respective materials) of the lamination structure, evaporation chambers are separately provided for the formation of pixels of respective colors (red, green and blue) and evaporation sources of all the materials (except for a cathode material) for forming a certain color pixel are provided in one evaporation chamber (801, 802 or 803) in the evaporation device shown in FIG. 8.

What is important is that, as regards the certain color pixel concerned, all the functional materials (hole transporting material, electron transporting material and the like) are evaporated without intervals up through the formation of the cathode to thereby prevent the formation of the impurity layer. Note that it is favorable that the cathode is finally deposited in common with pixels in a cathode evaporation chamber 804.

In this case, the impurity layer is formed between the cathode and the electron transporting region (or electron injecting region). However, the cathode material is injected into the electron transporting region (or electron injecting region) to some extent as in sputtering when the cathode is evaporated. This effect enables the impurity layer to be removed, and thus, a problem is not occurred. Of course, the deposition of the cathode may be conducted in each of the evaporation chambers (801 to 803).

A shadow mask which is a known technique is used for the application of respective colors of pixels. The state thereof is shown in FIGS. 9A to 9E. First, as shown in FIG. 9A, a substrate 901 on which a transparent electrode (anode) 902, is divided into a red pixel 911, a green pixel 912, and a blue pixel 913 by a bank-shaped structure 903, is carried into the evaporation chamber 801 for red pixel to form an organic compound film 904 for red pixel (the hole injecting region or electron injecting region may exist or not, but is omitted here). At this time, the substrate is covered by a metal mask 914 patterned so that the material is not mixed into pixels of other colors (blue pixel and green pixel) (FIG. 9B).

Next, the substrate is carried into the evaporation chamber 802 for green pixel to form an organic compound film 905 for green pixel. The metal mask 914 is at the position shifted from the previous position, so that the material is not mixed into other pixels (FIG. 9C). This is similar to the case of the formation of an organic compound film 906 for blue pixel (FIG. 9D). Finally, in the cathode evaporation chamber 804, a cathode 907 is deposited in common with the three pixels (FIG. 9E).

Note that the order of the formation of the organic compound films of the respective color pixels may be any order. In the above-mentioned manufacturing method of the display device, the formation is conducted in the order of red, green and blue.

Preferred materials for a hole injecting material, a hole transporting material, an electron transporting material, an electron injecting material, a blocking material, a light emitting material, a constituent material for a cathode, and the like are listed below. However, the materials used for the organic light emitting element of the present invention are not limited thereto.

Porphyrin-based compounds are effective among organic compounds as the hole injecting materials, and phthalocyanine (hereinafter referred to as "H.Pc"), capper phthalocyanine (hereinafter referred to as "CuPc"), and the like are given. There exist materials in which chemical doping is conducted to a conductive polymer compound, and polyethylene dioxythiophene (hereinafter referred to as "PEDOT") doped with polystyrenesulfonic acid (hereinafter referred to as "PSS"), polyaniline, polyvinyl carbazole (hereinafter referred to as "PVK"), and the like can be given. Further, a polymer compound of insulator is effective in terms of flatness of an anode, and polyimide (hereinafter referred to as "PI") is often used. In addition, an inorganic compound is used, and an ultrathin film of aluminum oxide (hereinafter referred to as "alumina") is given besides a metal thin film made of gold, platinum or the like.

Aromatic amine-based (that is, with bond of benzene ring and nitrogen) compounds are most widely used as the hole transporting materials. As the materials widely used, there can be given, in addition to above-described TPD, starburst type aromatic amine-based compounds such as 4,4'-bis[N-(1-naphthyl)-N-phenyl-amino]-biphenyl (hereinafter referred to as "α-NPD") that is a derivative thereof, 4,4',4"-tris (N, N-diphenyl-amino)-triphenylamine (hereinafter referred to as "TDATA"), and 4,4',4"-tris[N-(3-methylphenyl)-N-phenyl-amino]-triphenyla mine (hereinafter referred to as "MTDATA").

Metal complexes are often used as the electron transporting, materials, and metal complexes having a quinoline skeleton or a benzoquinoline skeleton such as above-described Alq$_3$, tris (4-methyl-8-quinolinolate) aluminum (hereinafter referred to as "Almq3") and bis (10-hydroxybenzo[h]-quinolinate beryllium (hereinafter referred to as "BeBq2"), bis (2-methyl-8-quinolinolate)-(4-hydroxy-biphenyl)-aluminum (hereinafter referred to as "BAlq") that is a mixed ligand complex, and the like are given. Also, there are given metal complexes having oxazole or thiazole ligand such as bis[2-(2-hydroxyphenyl)-benzooxazolate]zinc (hereinafter referred to as "Zn(BOX)2") and bis[2-(2-hydroxyphenyl)-benzothiozolate]zinc (hereinafter referred to as "Zn(BTZ)2"). Furthermore, in addition to the metal complexes, oxadiazole derivatives such as 2-(4-biphenyl)-5-(4-tert-butylphenyl)-1,3,4-oxadiazole (hereinafter referred to as "PBD") and 1,3-bis[5-(p-tert-butylphenyl)-1,3,4-oxadiazole-2-yl]benzene (hereinafter referred to as "OXD-7"), triazole derivatives such as 3-(4-tert-butylphenyl)-4-phenyl-5-(4-biphenyl)-1,2,4-triazole (hereinafter referred to as "TAZ") and 3-(4-tert-butylphenyl)-4-(4-ethylphenyl)-5-(4-biphenyl)-1,2,4-triazole (hereinafter referred to as "p-EtTAZ"), and phenanthroline derivatives such as bathophenanthroline (hereinafter referred to as "BPhen") and bathocuproin (hereinafter referred to as "BCP") have electron transporting property.

The above-described electron transporting materials can be used as the electron injecting materials. In addition, an ulrtathin film, which is formed of insulator such as an alkali metal halide such as lithium fluoride or alkali metal oxide such as lithium oxide, is often used. Further, alkali metal complexes such as lithium acetylacetonate (hereinafter referred to as "Li(acac)") and 8-quinolinolate-lithium (hereinafter referred to as "Liq") are also effective.

As the blocking materials, BAlq, OXD-7, TAZ, p-EtTAZ, BPhen, BCP, and the like described above are effective because of the high excitation energy level.

As the triplet light emitting, materials for red color, there are known 2, 3, 7, 8, 12, 13, 17, 18-octaethyl-21H, 23H-porphyrin-platinum (hereinafter referred to as "PtOEP"), bis[2-(2-pyridyl)-benzo[b]thiophene]-acetylacetonate-iridium (hereinafter referred to as "Ir(btp); (acac)" and the like.

EMBODIMENTS

[Embodiment 1]

Figure 4A:
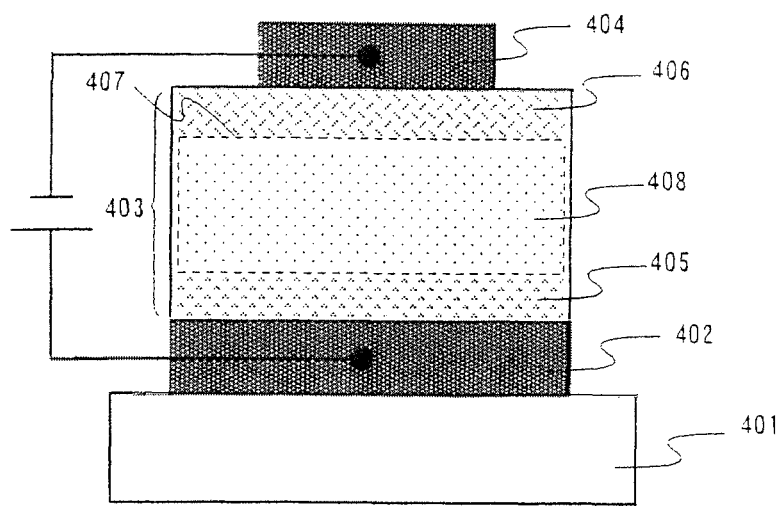
FIGS. 4A and 4B show structures of an organic light emitting element.

In this embodiment, an organic light emitting element shown in FIG. 4A, in which an electron injecting region composed of an electron injecting material is inserted between a cathode 404 and an organic compound film 403, is specifically exemplified.

First, ITO is deposited into a film with a thickness of approximately 100 nm by sputtering, and a glass substrate 401 on which an anode 402 is formed is prepared. The glass substrate 401 having the anode 402 is carried into the vacuum tank as shown in FIGS. 7A and 7B. In this embodiment, five evaporation sources are needed since five kinds of materials (four kinds corresponding to organic compounds and one kind corresponding to metal to be a cathode) are evaporated.

Then, α-NPD that is the hole transporting material is evaporated at an evaporation rate of 3 Å/s to form a hole transporting region with a thickness of 40 nm. Thereafter, while the evaporation rate for α-NPD is fixed at 3 Å/s, evaporation of BAlq$_2$ that is the electron transporting, material is started also at an evaporation rate of 3 Å s. That is, a mixed region 407 in which the ratio of the rates of α-NPD and Alq$_3$ is 1:1 is formed by co-evaporation.

Figure 4B:
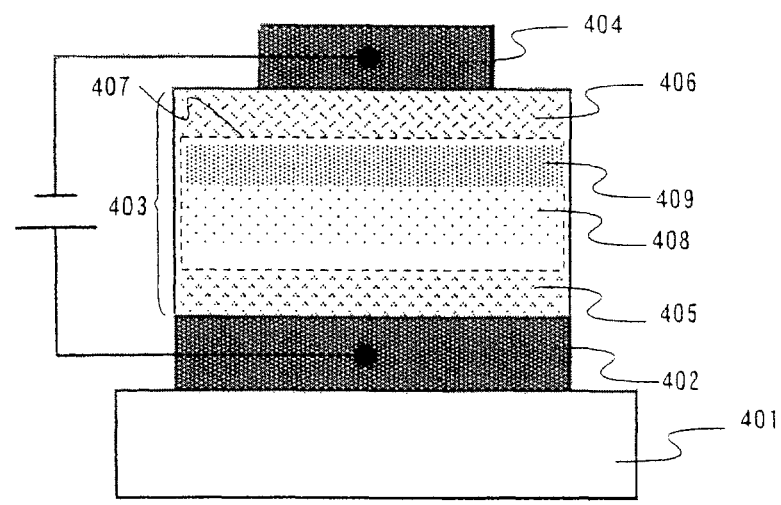

The mixed region 407 is formed with a thickness of 30 nm, and at this time, the middle region corresponding to 20 nm in the mixed region 407 (that is, 5 nm to 25 nm in 30 nm of the mixed region) is doped with PtOEP that is the triplet light emitting material for red color as a light emitting material 408 at a rate of 4 wt. %. α-NPD and BAlq$_2$ each have high excitation energy level, and thus, a blocking material 409 as shown in FIG. 4B is not required in case of this embodiment.

After the thickness of the mixed region 407 reaches 30 nm, while the evaporation of α-NPD is completed, the evaporation of BAlq$_2$ is continued, whereby an electron transporting region 406 is formed. The thickness is set to 10 nm. Further, the evaporation of BAlq$_2$ is completed and at the same time, evaporation of Alq$_3$ which is the electron injecting material, is started without putting an interval to evaporate by approximately 40 nm. The reason the interval is not put is that the formation of an impurity layer is prevented as described above. Finally, an Al:Li alloy as the cathode is evaporated to have a thickness of approximately 150 nm. Thus, a triplet light emitting element for emitting red color which derives from PtOEP is obtained.

[Embodiment 2]

In this embodiment, an organic light emitting element shown in FIG. 5 is specifically exemplified.

First, ITO is deposited into a film with a thickness of approximately 100 nm by sputtering, and a glass substrate 501 on which an anode 502 is formed is prepared. The glass substrate 501 having the anode 502 is carried into a vacuum tank as shown in FIGS. 7A and 7B. In this embodiment, eight evaporation sources are needed since eight kinds of materials (seven kinds corresponding to organic compounds and one kind corresponding to metal to be a cathode) are evaporated.

Then, after CuPc that is the hole injecting material is evaporated by 10 nm to form a hole injecting region 503, the evaporation of c-NPD that is the hole transporting material is started while CuPc is vaporized, whereby a mixed region 511 composed of CuPc and α-NPD is formed. The mixed region 511 is set to have a thickness of 10 nm.

Next, the evaporation of CuPc is stopped, and only α-NPD is evaporated by 30 nm to form a hole transporting region 504. Thereafter, evaporation of COP that is a host material is started while α-NPD is vaporized, whereby a mixed region 512 composed of α-NPD and CBP is formed. The mixed region 512 is set to have a thickness of 10 nm.

Next, the evaporation of α-NPD is stopped, and CBP is evaporated by 20 nm to form a light emitting region 505. During the formation of the light emitting region 505. PtOEP as the triplet light emitting material for red color is doped at 4 wt %. Thereafter, the vaporization of PtOEP is finished, and evaporation of BCP which is the blocking material, is started while CBP is vaporized, whereby a mixed region 513 composed of CBP and BCP is formed. The mixed region 513 is set to have a thickness of 5 nm.

Then, the evaporation of CBP is stopped, and BCP is evaporated by 10 nm to form a blocking region 506. Thereafter, while BCP is vaporized, evaporation of Alq$_3$ which is the electron transporting material, is started whereby a mixed region 514 composed of BCP and Alq$_3$ is formed. The mixed region 514 is set to have a thickness of 5 nm.

Subsequently, the evaporation of BCP is stopped, and Alq$_3$ is evaporated to form an electron transporting region 507 with a thickness of 40 nm. The evaporation of Alq$_3$ is finished, and at the same time, evaporation of Li(acac), which is the electron injecting material, is started without any interval to evaporate by approximately 2 nm. The reason the interval is not put is only that the formation of an impurity layer is prevented as described above.

Finally, aluminum as the cathode is evaporated by approximately 150 nm. Thus, a triplet light emitting element for emitting red color which derives from PtOEP is obtained.

[Embodiment 3]

In this embodiment, the structure of each pixel of the display device shown in FIGS. 9A to 9E, is specifically exemplified. The evaporation device shown in FIG. 8 is used as the evaporation device to thereby form each pixel. Note that the reference numerals in FIG. 8 and FIGS. 9A to 9E are referred herein below.

Figure 10A:
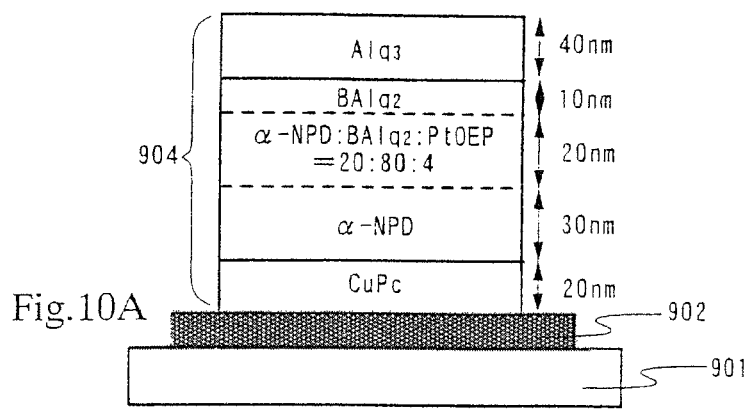
FIGS. 10A to 10C show structures of respective pixels.

First, the substrate shown in FIG. 9A is carried into the evaporation chamber 801 for red pixel, and a triplet light emitting element for red color as shown in FIG. 10A is manufactured. Here, CuPc is the hole injecting material, α-NPD is the hole transporting material. BAlq$_2$ is the electron transporting material, and Alq$_3$ is the electron injecting material. PtOEP is doped into a mixed region composed of α-NPD and BAlq$_2$. The weight ratio thereof is set to α-NPD:BAlq$_2$:PtOEP=20:80:4. Note that attention is paid to in order that intervals are not occurred between CuPc and α-NPD and between BAlq$_2$ and Alq$_3$ to thereby prevent the formation of an impurity layer.

Figure 10B:
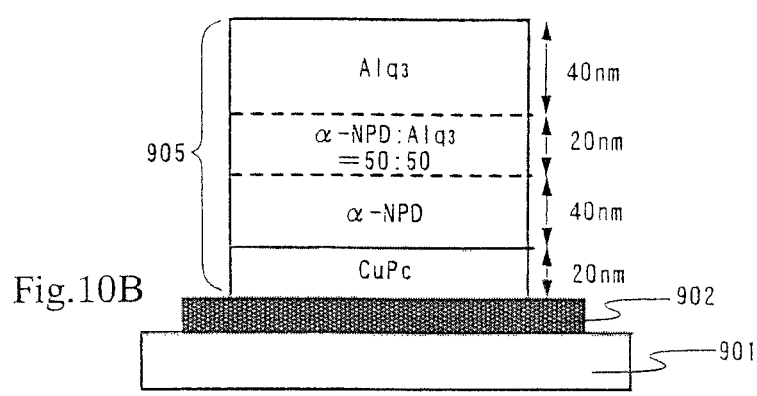

Next, the substrate is carried into the evaporation chamber 802 for green pixel, and a green singlet light emitting element having the mixed region shown in FIG. 10B is manufactured. Here, CuPc is the hole injecting material, α-NPD is the hole transporting material, and Alq$_3$ is the electron transporting material and also light emitting material. The weight ratio in the mixed region is set to α-NPD:Alq$_3$=50:50. Note that attention is paid to in order that an interval is not occurred between CuPc and α-NPD to thereby prevent the formation of an impurity layer.

Figure 10C:
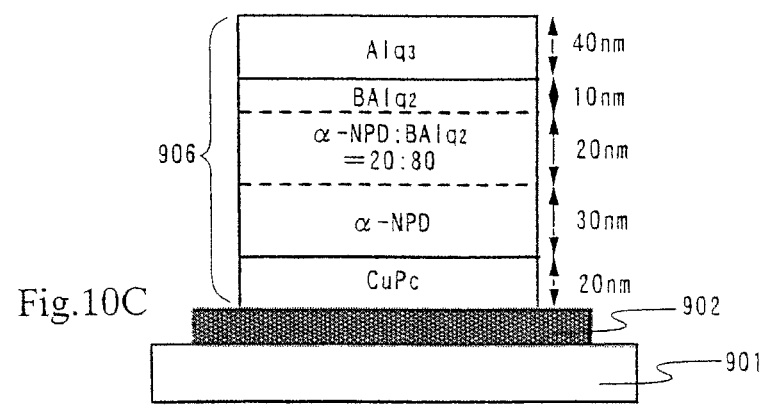

Further, the substrate is carried into the evaporation chamber 803 for blue pixel, and a blue singlet light emitting element including the mixed region shown in FIG. 10C is manufactured. Here, CuPc is the hole injecting material, α-NPD is the hole transporting material and also light emitting material. BAlq$_2$ is the electron transporting material, and Alq$_3$ is the electron injecting material. The weight ratio in the mixed region is set to α-NPD:BAlq$_2$=20:80. Note that attention is paid to in order that intervals are not occurred between CuPc and α-NPD and between BAlq$_2$ and Alq$_3$ to thereby prevent the formation of an impurity layer.

Finally, an Al:Li alloy is evaporated by approximately 150 nm as a cathode. Thus, a full-color display device, in which a pixel for red color light emission which derives from PtOEP, a pixel for green color light emission which derives from Alq$_3$, and a pixel for blue color light emission which derives from α-NPD are used, can be realized.

[Embodiment 4]

A whole structure of a full-color light emitting device as shown in Embodiment 3 is described in this Embodiment.

Figure 11:
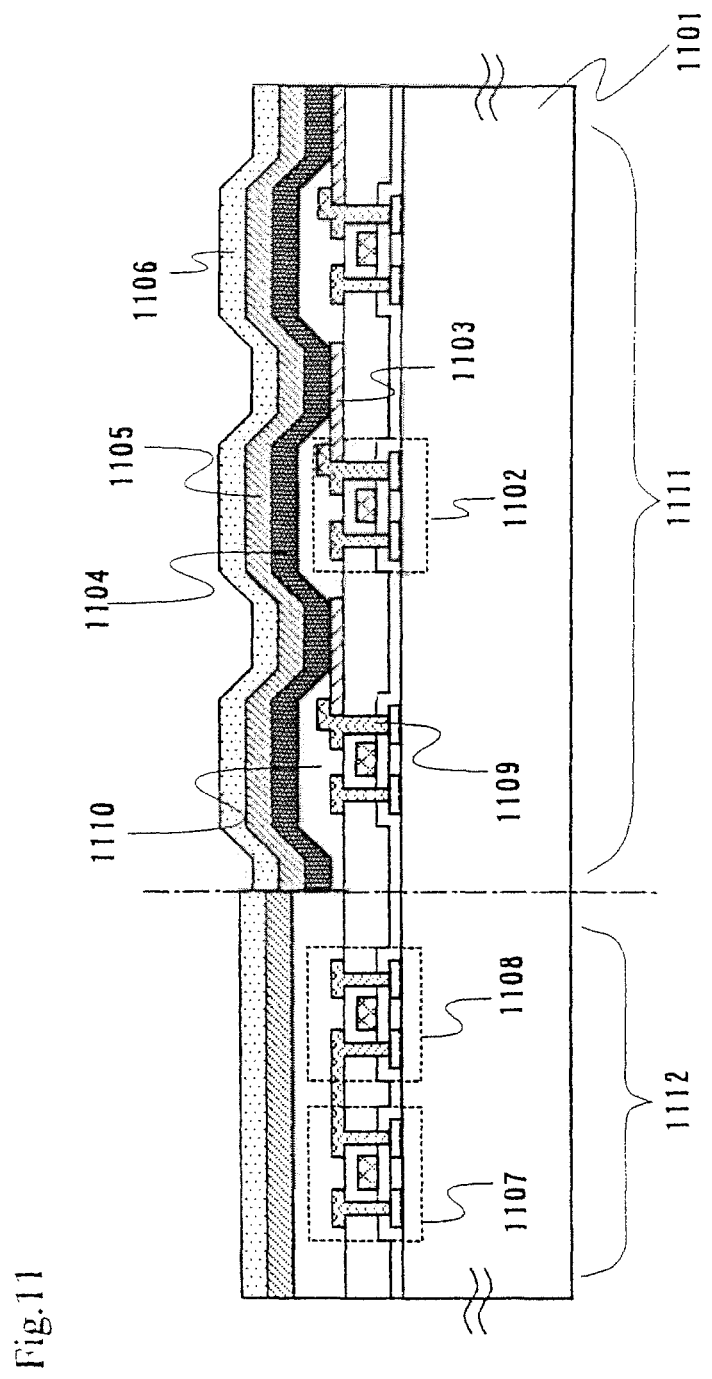
FIG. 11 shows a cross sectional structure of a display device.

FIG. 11 is a cross sectional diagram of an active matrix light emitting device that uses the organic light emitting elements of the present invention. Note that although thin film transistors (hereafter referred to as TFTs) are used here as active elements. MOS transistors may also be used.

Further, the example shown here uses top gate TFTs (specifically, planer TFTs) as the TFTs, but bottom gate TFTs (typically reverse stagger TFTs) can also be used.

Reference numeral 1101 denotes a substrate in FIG. 11, and a substrate through which visible light can pass is used as the substrate. Specifically, a glass substrate, a quartz substrate, a crystallized glass substrate, or a plastic substrate (including plastic films) may be used. Note that an insulating film formed on the surface is also included in the substrate 1101.

A pixel portion 1111 and a driver circuit portion 1112 are formed on the substrate 1101. The pixel portion 1111 is explained first.

The pixel portion 1111 is a region for performing image display. A plurality of pixels exist on the substrate, and a TFT 1102 for controlling the amount of electric current flowing in an organic light emitting element (hereafter referred to as an electric current control TFT), a pixel electrode (anode) 1103, an organic compound film 1104, and a cathode 1105 are formed in each pixel. Note that although only the electric current control TFT is shown in FIG. 11, a TFT for controlling the amount of voltage applied to a gate of the electric current control TFT (hereafter referred to as a switching TFT) is also formed.

It is preferable that a p-channel TFT be used for the electric current control TFT 1102. Although it is possible to use an n-channel TFT, using a p-channel TFT can more effectively suppress the amount of electric current consumption in the case where an anode of the organic light emitting element is connected to the electric current control TFT, as shown in FIG. 11.

Further, the pixel electrode 1103 is electrically connected to a drain of the electric current control TFT 1102. A conductive material having a work coefficient of 4.3 to 5.3 eV is used as a material for the pixel electrode 1103 in Embodiment 4, and therefore the pixel electrode 1103 functions as the anode of the organic light emitting element. Indium oxide, tin oxide, zinc oxide, or a compound of these (such as ITO) may typically be used as the pixel electrode 1103. The organic compound film 1104 is formed on the pixel electrode 1103.

In addition, the cathode 1105 is formed on the organic compound film 1104. It is preferable to use a conductive material having a work coefficient from 2.3 to 3.3 eV as a material for the cathode 1105. A conductive film containing an alkaline metal element or an alkaline earth metal element, a conductive film containing aluminum, a lamination of these conductive films with aluminum or silver, and the like may typically be used as the cathode 1105.

Further, the layer composed of the pixel electrode 1103, the organic compound film 1104, and the cathode 1105 is covered by a protective film 1106. The protective film 1106 is formed in order to protect the organic light emitting elements from oxygen and water. Silicon nitride, silicon oxynitride, aluminum oxide, tantalum oxide, or carbon (typically diamond like carbon) is used as a material for the protective film 1106.

The driver circuit 1112 is explained next. The driver circuit 1112 is a region for controlling, the timing of signals sent to the pixel portion 1111 (gate signals and data signals), and a shift register, a buffer, a latch, an analog switch (transfer gate) and a level shifter are formed. A CMOS circuit composed of an n-channel TFT 1107 and a p-channel TFT 1108 is shown in FIG. 11 as a basic unit for these circuits.

Note that known structures may be used for the circuit structures of the shift register, the buffer, the latch, the analog switch (transfer gate), and the level shifter circuits. Further, although the pixel portion 1111 and the driver circuit 1112 are formed on the same substrate in FIG. 11, an IC or LSI can also be electrically connected without forming the driver circuit.

Furthermore, although the pixel electrode (anode) 1103 is electrically connected to the electric current control TFT 1102 in FIG. 11, a structure in which the cathode is connected to the electric current control TFT can also be used. In this case, the pixel electrode may be formed by the same material as that of the cathode 1105, and the cathode may be formed by the same material as that of the pixel electrode (anode) 1103. It is preferable that the electric current control TFT be an n-channel TFT in this case.

The light emitting device shown in FIG. 11 is one manufactured by a step of forming a wiring 1109 after forming the pixel electrode 1103. In this case there is the possibility that the pixel electrode 1103 will have surface roughness. The organic light emitting element is an electric current driven element, and therefore it is thought that its properties will deteriorate due to surface roughness of the pixel electrode 1103.

Figure 12:
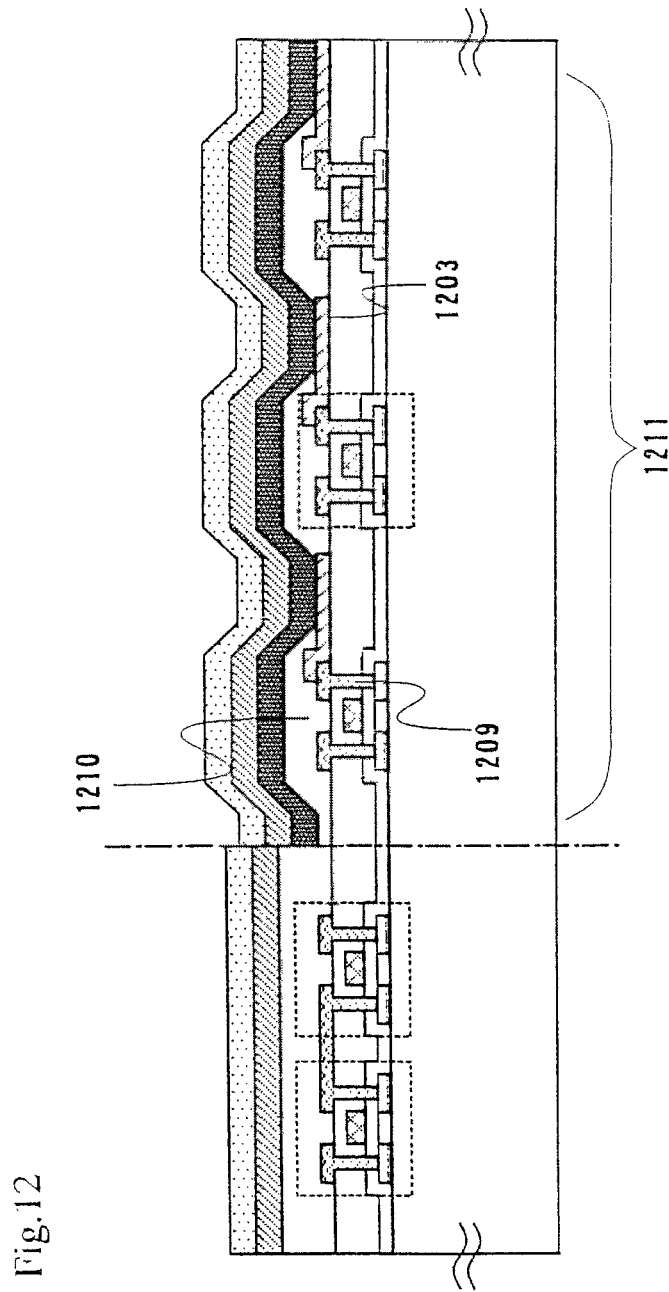
FIG. 12 shows a cross sectional structure of a display device.

A light emitting device in which a pixel electrode 1203 is formed after forming a wiring 1209 can also be considered, as shown in FIG. 12. In this case, electric current injection from the pixel electrode 1203 is improved compared to the structure of FIG. 11.

Further, each pixel arranged in the pixel portion 1111 and the pixel portion 1211 is separated by positive taper bank shape structures 1110 and 1210 in FIG. 11 and FIG. 12, respectively. The bank shape structure can also be structured such that the bank shape structure does not contact the pixel electrode by using a reverse taper structure, for example. An example thereof is shown in FIG. 13.

Figure 13:
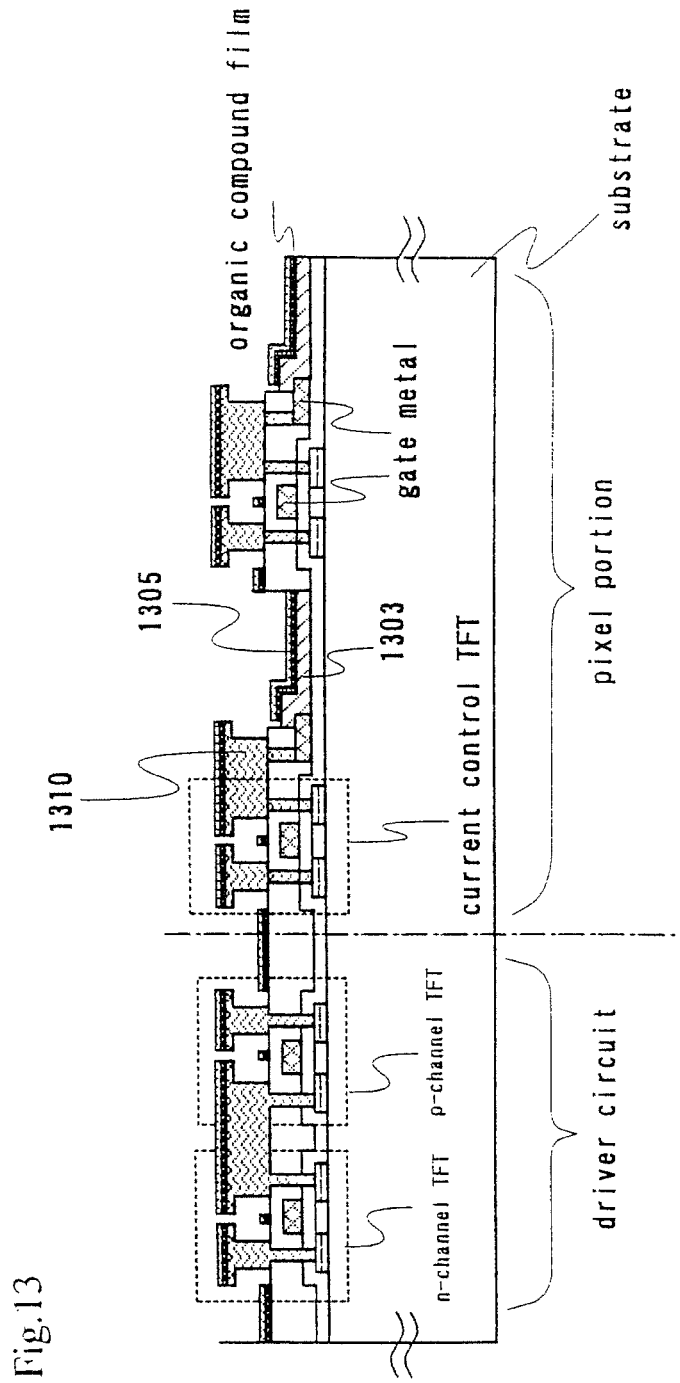
FIG. 13 shows a cross sectional structure of a display device.

A wiring and separation portion 1310, serving both as a wiring and a separation portion, is formed in FIG. 13. The shape of the wiring and separation portion 1310 shown in FIG. 13 (a structure having an overhang) can be formed by laminating a metal which composes a wiring, and a material having an etching rate lower than that of the metal (for example, a metal nitride), and then performing etching thereto. Short circuits between a pixel electrode 1303 or the wiring, and a cathode 1305, can be prevented due to such a shape. Note that, differing from a normal active matrix light emitting device, a structure in which the cathodes 1305 on the pixels are given a stripe shape (similar to cathodes in passive matrix light emitting device) is shown in FIG. 13.

Figure 14A:
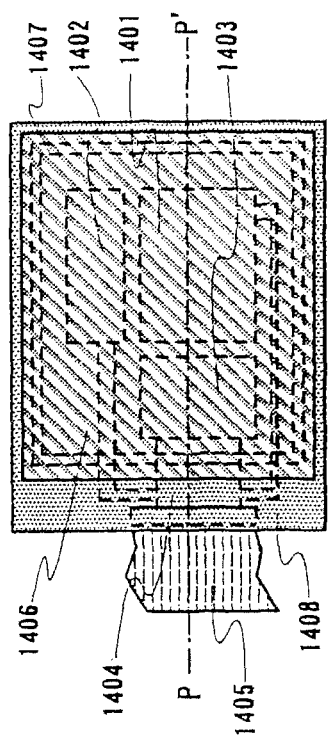
FIGS. 14A and 14B show a top surface structure and a cross sectional structure of a display device.
Figure 14B:
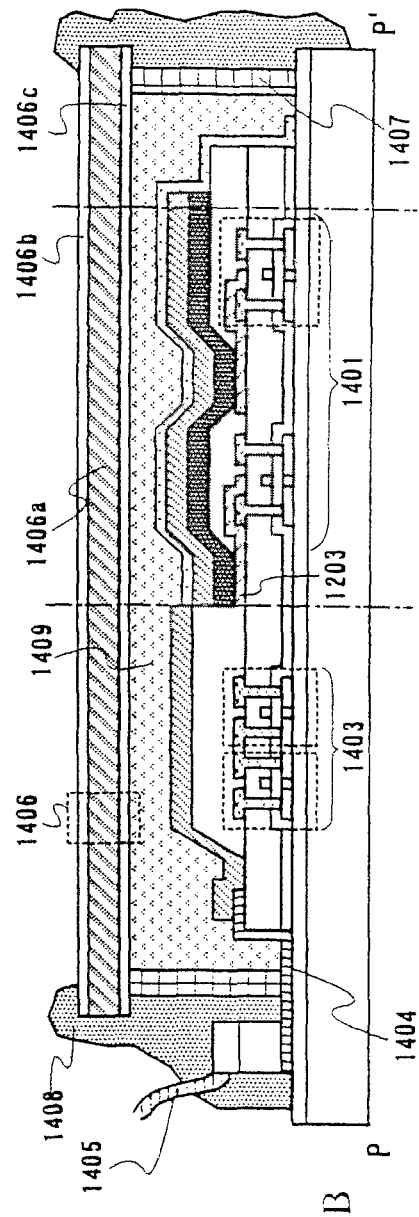

An external view of the active matrix light emitting device of FIG. 12 is shown in FIGS. 14. Note that FIG. 14A shows a top surface diagram, and that a cross sectional diagram in which FIG. 14A is cut along a line P-P is shown in FIG. 14B. Further, the symbols used in FIG. 12 are also used in FIGS. 14A and 14B.

Reference numeral 1401 in FIG. 14A denotes a pixel portion, reference numeral 1402 denotes a gate signal line driver circuit, and reference numeral 1403 denotes a data signal line driver circuit. Further, signals sent to the gate signal line driver circuit 1402 and to the data signal line driver circuit 1403 are input from a TAB (tape automated bonding) tape 1405. through an input wiring 1404. Note that, although not shown in the figures, a TCP (tape carrier package) in which an IC (integrated circuit) is formed in a TAB tape may be connected instead of the TAB tape 1405.

Reference numeral 1406 denotes a cover material formed above the organic light emitting elements shown in FIG. 12, and the cover material 1406 is bonded using a sealant 1407 made from a resin. Any material may be used for the cover material 1406, provided that oxygen and water cannot pass through the material. As shown in FIG. 14B, a cover made from a plastic material 1406a, and having carbon films 1406b and 1406c (specifically, diamond like carbon films) formed on the obverse and reverse surfaces of the plastic material 1406a, is used in Embodiment 4.

In addition, the sealant 1407 is covered by a sealing material 1408 made from a resin, and the organic light emitting elements are completely encapsulated in a closed space 1409 as shown in FIG. 14B. The sealed space 1409 may then be filled with an inert gas (typically nitrogen gas or a noble gas), a resin, or an inert liquid (for example, a liquid state fluorocarbon, typically perfluoroalkane). In addition, it is also effective to form a hygroscopic agent or a deoxidant.

Further, a polarization plate may also be formed in a display surface of the light emitting device (a surface on which images are observed) according to Embodiment 4. The polarization plate suppresses reflection of light made incident from the outside, and is effective in preventing a user s own image from being projected into the display surface. A circular polarization plate is generally used. However, it is preferable to use a structure which gives little internal reflection, by adjusting the index of refraction, in order to prevent light emitted from the organic compound layer from being reflected by the polarization plate and returning to the inside.

Note that any of the organic light emitting elements disclosed by the present invention may be used as the organic light emitting elements contained in the light emitting device of Embodiment 4.

[Embodiment 5]

Figure 15A:
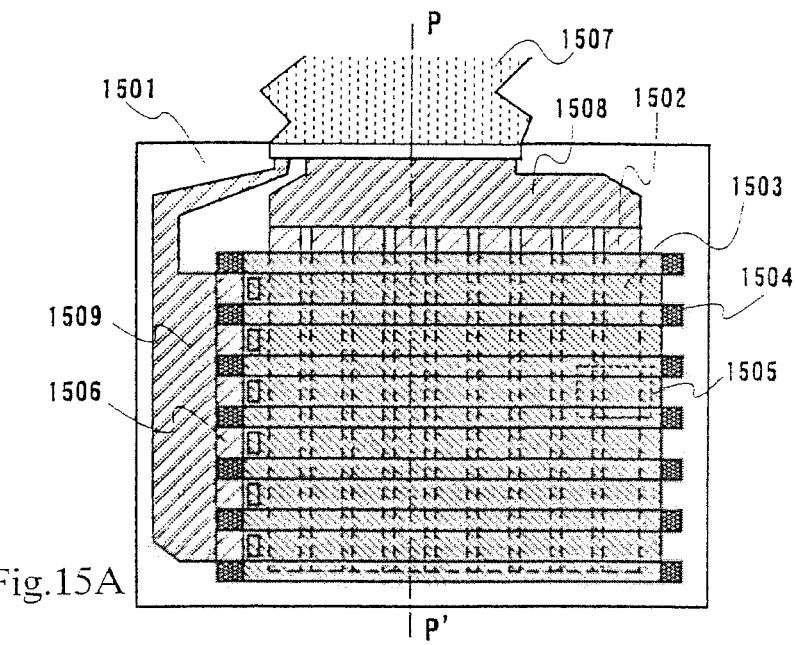
FIGS. 15A to 15C show a top surface structure and cross sectional structures of a display device.
Figure 15B:
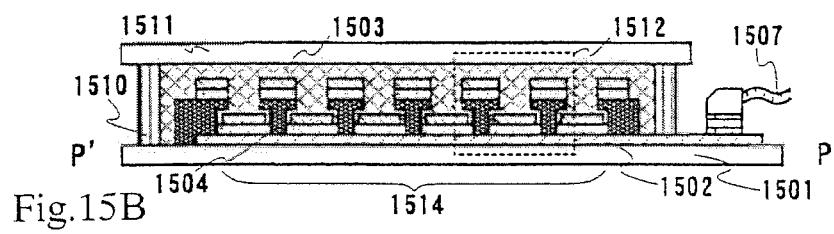

In this embodiment, a passive matrix light emitting device will be described as an example of a light emitting device including an organic EL device disclosed by the present invention. FIG. 15A is a top view thereof and FIG. 15B is a cross sectional view obtained by cutting FIG. 15A along a dashed line P-P'.

In FIG. 15A, reference numeral 1501 denotes a substrate and a plastic member is used here. As the plastic member, a plate shaped or a film shaped member made of polyimide. polyamide, acrylic resin, epoxy resin, PES (polyether sulfone), PC (polycarbonate), PET (polyethylene terephthalate) or PEN (polyether nitrile) can be used.

Reference numeral 1502 denotes scan lines (anode layers) made from conductive oxide films. In this embodiment, conductive oxide films in which gallium oxide is added to zinc oxide are used. Reference numeral 1503 denotes data lines (cathode layers) made from metal films. In this embodiment, an bismuth films are used. Reference numeral 1504 denotes banks made of acrylic resins. The banks 1504 function as isolation walls for separating the data lines 1503. Both the scan lines 1502 and the data Line 1503 are formed with stripe shapes and provided orthogonal to each other. Note that although not shown in FIG. 15A, an organic compound layer is sandwiched between the scan lines 1502 and the data lines 1503 and intersection portions 1505 become pixels.

The scan lines 1502 and the data lines 1503 are connected with an external driver circuit through a TAB tape 1507. Note that reference numeral 1508 denotes a wiring group made from a set of scan lines 1502 and reference numeral 1509 denotes a wiring group made from a set of connection wirings 1506 connected with the data lines 1503. Also, although not shown, instead of the TAB tape 1507, a TCP in which an IC is provided in the TAB tape may be connected with the scan lines and the data lines.

In FIG. 15B, reference numeral 1510 denotes a sealing member and reference numeral 1511 denotes a cover member adhered to the plastic substrate 1501 through the sealing member 1510. A light curable resin is preferably used as the sealing member 1510 and a material in which degassing, is less and which has low hygroscopicity is preferable. It is preferable that the cover member is made of the same material as the substrate 1501 and glass (including quartz glass) or plastic can be used. Here, a plastic member is used.

Figure 15C:
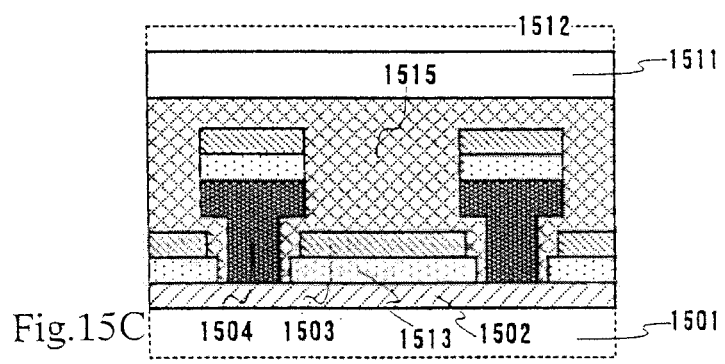

Next, an enlarged view of a structure of a pixel region 1512 is shown in FIG. 15C. Reference numeral 1513 denotes an organic compound layer. Note that, as shown in FIG. 15C, banks 1504 are formed with a shape in which a width of the lower layer is narrower than that of the upper layer, and thus the data lines 1503 can be physically separated form each other. A pixel portion 1514 surrounded by the sealing member 1510 is blocked from outside air by a sealing member 1515 made of a resin, and thus a structure is obtained such that deterioration of the organic compound layer is prevented.

In the light emitting device of the present invention having the above structure, the pixel portion 1514 is constructed by the scan lines 1502, the data lines 1503, the banks 1504, and the organic compound layer 1513. Thus, the light emitting device can be manufactured by a very simple process.

Also, a polarization plate may be provided in a display screen (image viewing surface) of the light emitting device described in this embodiment. This polarization plate has an effect that the reflection of light incident from the outside is suppressed and a viewer is prevented from being reflected in the display screen. Generally, a circular polarization plate is used. Note that, in order to prevent the case where light emitted from the organic compound layer is reflected by the polarization plate and returned to the inner portion, it is preferable to use a structure in which the refractive index is adjusted to reduce inner reflection.

Note that, as the organic EL element included in the light emitting device of this embodiment, any one of the organic EL elements disclosed by the present invention may be used.

[Embodiment 6]

In this embodiment, an example of a module in which a printed wiring board is provided in the light emitting device described in Embodiment 5 will be described.

Figure 16A:
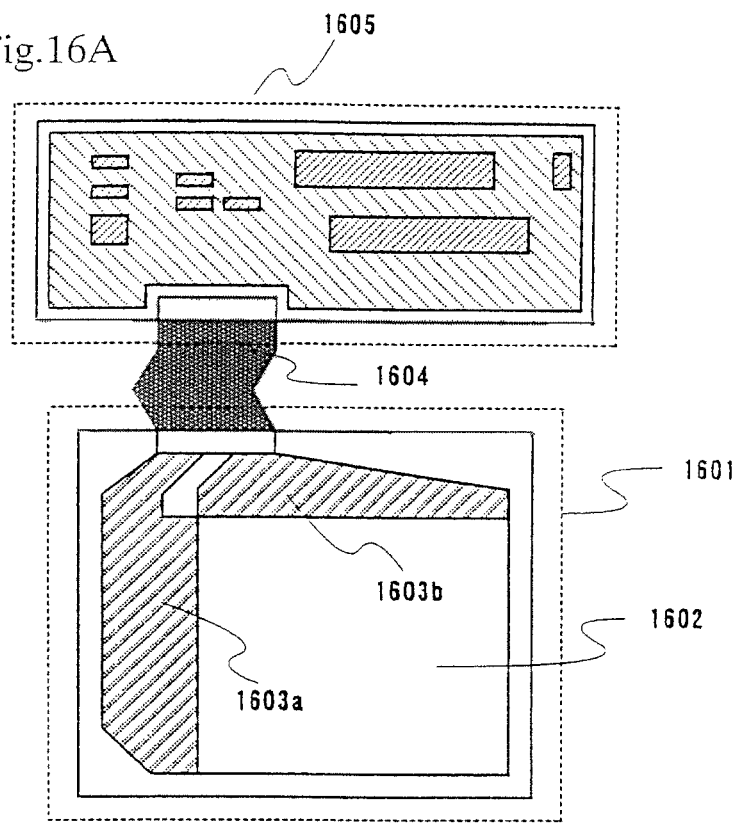
FIGS. 16A and 16B show structures of a display device.

In a module shown in FIG. 16A, a TAB tape 1604 is attached to a substrate 1601 (here, including a pixel portion 1602 and wirings 1603a and 1603b) and a printed wiring board 1605 is attached to the substrate 1601 through the TAB tape 1604.

Figure 16B:
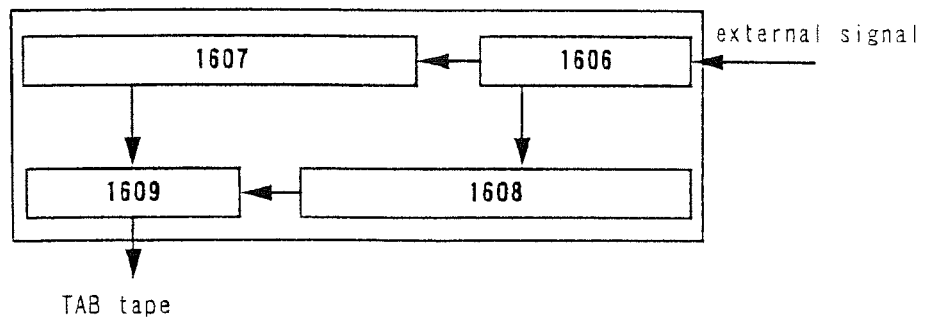

Here, a functional block view of the printed wiring board 1605 is shown in FIG. 16B. An IC which functions as at least I/O ports (input portion and output portion) 1606 and 1609, a data signal side driver circuit 1607, and a gate signal side driver circuit 1608 is provided in the inner portion of the printed wiring board 1605.

Therefore, the module in which the TAB tape is attached to the substrate in which the pixel portion is formed on a substrate surface and the printed wiring board having a function as the driver circuit is attached to the substrate through the TAB tape is called a driver circuit external module in particular in this specification.

Note that, as the organic EL element included in the light emitting device of this embodiment, any one of the organic EL elements disclosed by the present invention may be used.

[Embodiment 7]

In this embodiment, an example of a module in which a printed wiring board is provided in the light emitting device described in Embodiment 4 or 5 will be described.

Figure 17A:
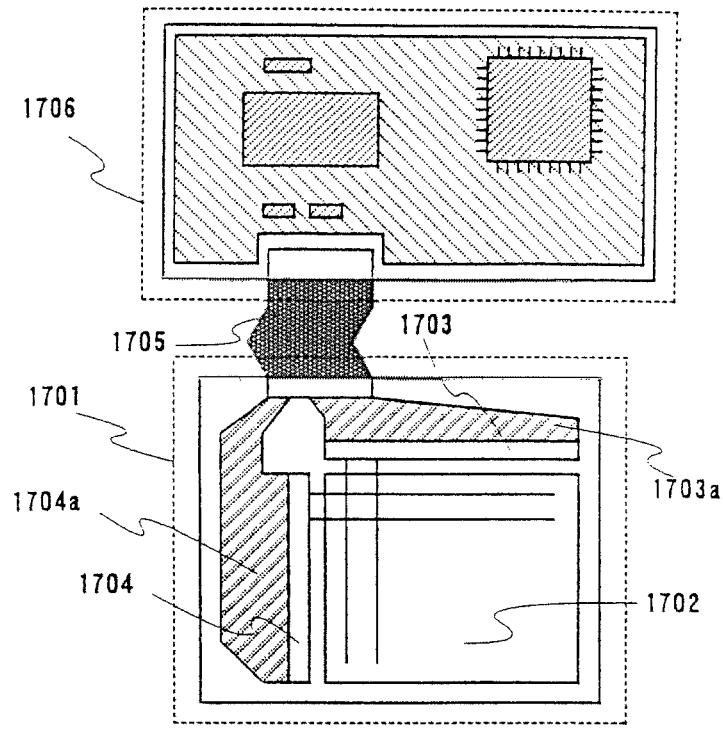
FIGS. 17A and 17B show structures of a display device.

In a module shown in FIG. 17A, a TAB tape 1705 is attached to a substrate 1701 (here, including a pixel portion 1702, a data signal side driver circuit 1703, a gate signal side driver circuit 1704, and wirings 1703a and 1704a) and a printed wiring board 1706 is attached to the substrate 1701 through the TAB tape 1705. A functional block view of the printed wiring board 1706 is shown in FIG. 17B.

Figure 17B:
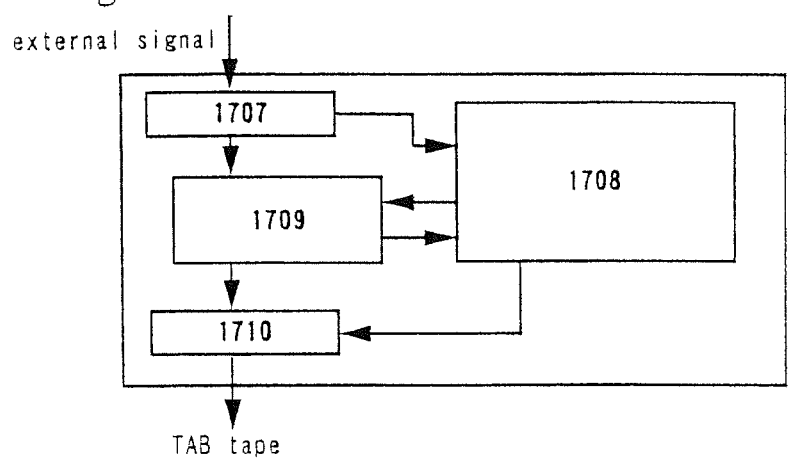

As shown in FIG. 17B, an IC which functions as at least I/O ports 1707 and 1710 and a control portion 1708 is provided in the inner portion of the printed wiring board 1706. Note that, although a memory portion 1709 is provided here, it is not necessarily provided. Also, the control portion 1708 has a function of controlling operations of the driver circuits, correction of image data, and the like.

Therefore, the module in which the printed wiring board having a function as the controller is attached to the substrate in which the organic EL element is formed is called a controller external module in particular in this specification.

Note that, as the organic EL element included in the light emitting device of this embodiment, any one of the organic EL elements disclosed by the present invention may be used.

[Embodiment 8]

An example of a light emitting device in which triplet light emitting elements like those shown by Embodiment 1 and 2 are driven by a digital time gray scale display is shown in Embodiment 8. The light emitting device of Embodiment 8 is extremely useful because high efficiency light emission can be achieved by utilizing light emitted from a triplet excitation state, and at the same time a uniform image can be obtained by employing digital time gray scale display.

A circuit structure of a pixel used in the organic light emitting element is shown in FIG. 18A. Reference symbols Tr1 and Tr2 denote transistors, and reference symbol Cs denotes a storage capacitor. An electric current flows from a source line to the transistor Tr1 in this circuit if a gate line is selected, and a voltage corresponding to that signal is stored in the storage capacitor Cs. An electric current controlled by a voltage Vgs between a gate and a source of the transistor Tr2 then flows in the transistor Tr2 and in the or in the organic light emitting element.

The transistor Tr1 is placed in an off state after Tr1 has been selected, and the voltage Vgs of the storage capacitor Cs is stored. The electric current depending only upon the voltage Vgs can therefore continue to flow.

A chart for showing driving this type of circuit by digital time gray scale display is shown in FIG. 18B. One frame is divided into a plurality of sub-frames, and 6 bit gray scale is shown in FIG. 18B with one frame divided into 6 sub-frames. The ratio of light emitting periods for each of the sub-frames becomes 32::16::8::4::2::1 in this case.

The concept of a driver circuit of the 1 substrate in Embodiment 8 is shown in FIG. 18C. A gate driver and a source driver are formed on the same substrate. A pixel circuit and a driver are set so as to perform digital drive, and therefore a uniform image can be obtained that is not influenced by dispersion in the TFT properties.

[Embodiment 9]

The light emitting devices of the present invention which have been described in the embodiments above have advantages of low power consumption and long lifetime. Accordingly, electric appliances that include those light emitting devices as their display units can operate consuming less power than conventional ones and are durable. The advantages are very useful especially for electric appliances that use batteries as power sources, such as portable equipment, because low power consumption leads directly to conveniences (batteries last longer).

The light emitting device is self-luminous to eliminate the need for back light as the one in liquid crystal displays, and has an organic compound film whose thickness is less than 1 nm. Therefore the light emitting device can be made thin and light-weight. Electric appliances that include the light emitting device as their display units are accordingly thinner and lighter than conventional ones. This too leads directly to conveniences (lightness and compactness in carrying them around) and is very useful particularly for portable equipment and like other electric appliances. Moreover, being thin (unvoluminous) is doubtlessly useful for all of the electric appliances in terms of transportation (a large number of appliances can be transported in a mass) and installation (space-saving).

Being self-luminous, the light emitting device is characterized by having better visibility in bright places than liquid crystal display devices and wide viewing angle. Therefore electric appliances that include the light emitting device as their display units are advantageous also in terms of easiness in viewing display.

To summarize, electric appliances that use a light emitting device of the present invention have, in addition to merits of conventional organic light emitting elements, namely, thinness/lightness and high visibility, new features of low power consumption and long lifetime, and therefore are very useful.

This embodiment shows examples of the electric appliances that include as display units the light emitting device of the present invention. Specific examples thereof are shown in FIGS. 19 and 20. The organic light emitting element included in the electric appliance of this embodiment can be any element according to the present invention. The light emitting device included in the electric appliance of this embodiment can have any of the configurations illustrated in FIGS. 11 to 18.

Figure 19A:
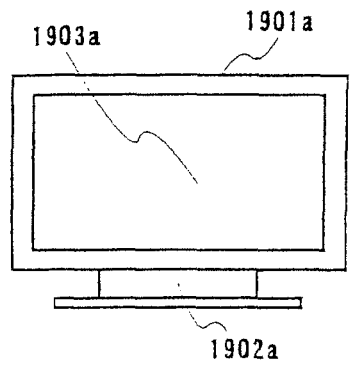
FIGS. 19A to 19F show specific examples of electric devices.

FIG. 19A shows a display device using an organic light emitting element. The display is composed of a case 1901a, a support base 1902a, and a display unit 1903a. By using a light emitting device of the present invention as the display unit 1903a, the display can be thin and light-weight, as well as durable. Accordingly, transportation is simplified, space is saved in installation, and lifetime is long.

Figure 19B:
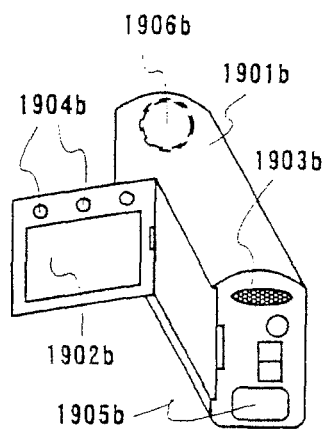

FIG. 19B shows a video camera, which is composed of a main body 1901b, a display unit 1902b, an audio input unit 1903b, operation switches 1904b, a battery 1905b, and an image receiving unit 1906b. By using a light emitting device of the present invention as the display unit 1902b, the video camera can be thin and light-weight, and consumes less power. Accordingly, battery consumption is reduced and carrying the video camera is less inconvenient.

Figure 19C:
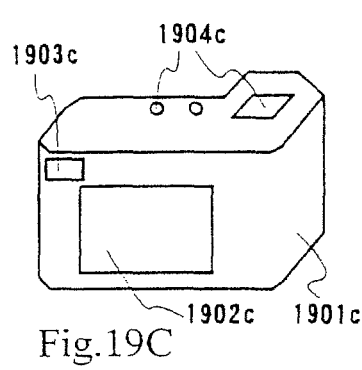

FIG. 19C shows a digital camera, which is composed of a main body 1091c, a display unit 1902c, an eye piece unit 1903c, and operation switches 1904c. By using a light emitting device of the present invention as the display unit 1902c, the digital camera can be thin and light-weight, and consumes less power. Accordingly, battery consumption is reduced and carrying the digital camera is less inconvenient.

Figure 19D:
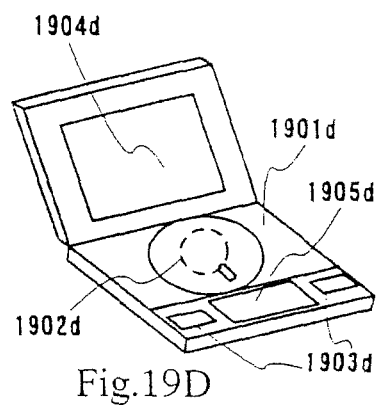

FIG. 19D shows an image reproducing device equipped with a recording medium. The device is composed of a main body 1901d, a recording medium (such as CD, LD, or DVD) 1902d, operation switches 1903d, a display unit (A) 1904d, and a display unit (B) 1905d. The display unit (A) 1904d mainly displays image information whereas the display unit (B) 1905d mainly displays text information. By using a light emitting device of the present invention as the display unit (A) 1904d and the display unit (B) 1905d, the image reproducing device consumes less power and can be thin and light-weight as well as durable. The image reproducing device equipped with a recording medium also includes CD players and game machines.

Figure 19E:
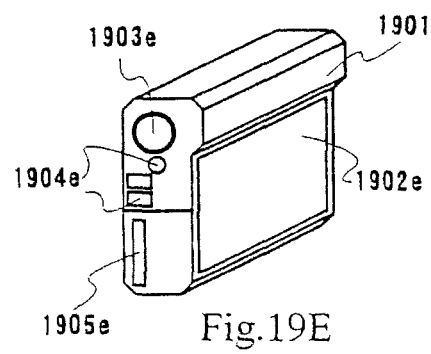

FIG. 19E shows a (portable) mobile computer, which is composed of a main body 1901e, a display unit 1902e, an image receiving unit 1903e, a switch 1904e, and a memory slot 1095e. By using a light emitting device of the present invention as the display unit 1902e, the portable computer can be thin and light-weight, and consumes less power. Accordingly, battery consumption is reduced and carrying the computer is less inconvenient. The portable computer can store information in a flash memory or a recording medium obtained by integrating non-volatile memories and can reproduce the stored information.

Figure 19F:
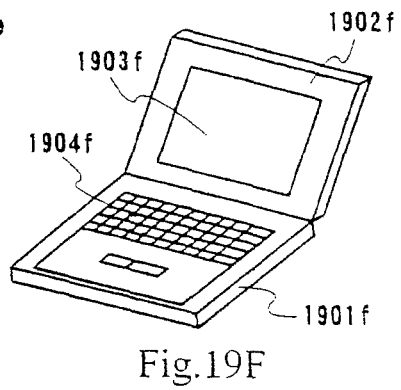

FIG. 19F shows a personal computer, which is composed of a main body 1901f, a case 1902f, a display unit 1903f, and a keyboard 1904f. By using a light emitting device of the present invention as the display unit 1903f, the personal computer can be thin and light-weight, and consumes less power. The light emitting device is a great merit in terms of battery consumption and lightness especially for a notebook personal computer or other personal computers that are carried around.

These electric appliances now display with increasing frequency information sent through electronic communication lines such as the Internet and radio communications such as radio wave, especially, animation information. Since organic light emitting elements have very fast response speed, the light emitting device is suitable for animation display.

Figure 20A:
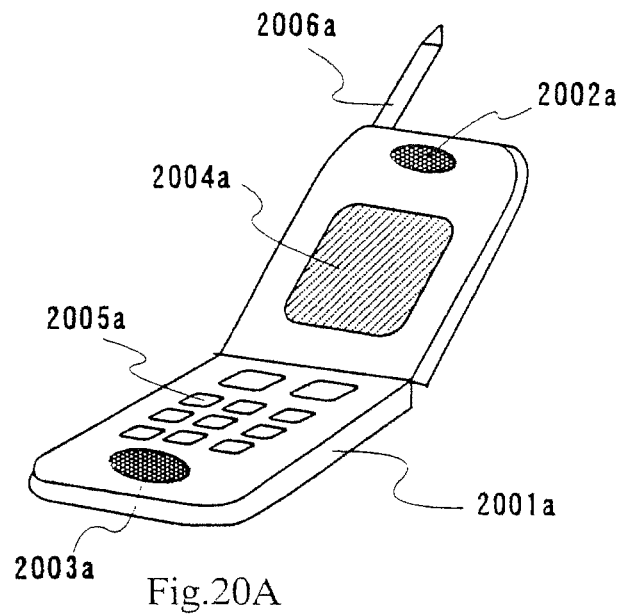
FIGS. 20A and 20B show specific examples of electric devices.

FIG. 20A shows a cellular phone, which is composed of a main body 2001a, an audio output unit 2002a, an audio input unit 2003a, a display unit 2004a, operation switches 2005z, and an antenna 2006a. By using a light emitting device of the present invention as the display unit 2004a, the cellular phone can be thin and light-weight, and consumes less power. Accordingly, battery consumption is reduced, carrying the cellular phone is easy, and the main body is compact.

Figure 20B:
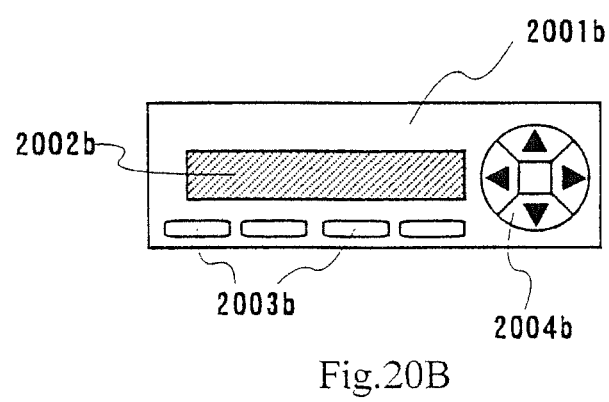

FIG. 20B shows audio (specifically, car audio), which is composed of a main body 2001b, a display unit 2002b, and operation switches 2003b and 2004b. By using a light emitting device of the present invention as the display unit 2002b, the audio can be thin and light-weight, and consumes less power. Although car audio is taken as an example in this embodiment, the audio may be home audio.

It is effective to give the electric appliances shown in FIGS. 19 to 20 a function of modulating the luminance of emitted light in accordance with the brightness of the surroundings where the electric appliances are used by providing the electric appliances with photo sensors as measures to detect the brightness of the surroundings. A user can recognize image or text information without difficulties if the contrast ratio of the luminance of emitted light to the brightness of the surroundings is 100 to 150. With this function, the luminance of an image can be raised for better viewing when the surroundings are bright whereas the luminance of an image can be lowered to reduce power consumption when the surroundings are dark.

The reduction in luminance of the triplet light emitting element for red color can be suppressed to lengthen the element life by implementing the present invention. Thus, the organic light emitting element for red color can be provided in which emission efficiency is high and a life is long in comparison with prior art.

Further, the display device can be provided in which a balance of the three primary colors of light is favorable, besides, power consumption is low, and a chance of color fluctuation with time is small in comparison with prior art, by using the triplet light emitting element for red color and the singlet light emitting elements for green color and blue color. Furthermore, the electric device can be provided in which power consumption is low in comparison with prior art and which has a display portion exhibiting a clear display that never fades even with the lapse of time by using the above-mentioned display device.

What is claimed is:

1. A light-emitting device comprising:
   a first light-emitting element over a substrate; and
   a second light-emitting element over the substrate,
   wherein the first light-emitting element comprises a mixed region between a pair of electrodes,
   wherein the first light-emitting element comprises a material capable of emitting light from a triplet excitation state,
   wherein the second light-emitting element comprises a material capable of emitting light from a singlet excitation state,
   wherein the mixed region comprises the material capable of emitting light from the triplet excitation state, and
   wherein the material capable of emitting light from the triplet excitation state is a dopant.

2. The light-emitting device according to claim 1, wherein the material capable of emitting light from the singlet excitation state exhibits blue color light emission.

3. The light-emitting device according to claim 1, wherein the first light-emitting element and the second light-emitting element are not overlapped with each other.

4. The light-emitting device according to claim 1, wherein the mixed region comprises a hole transporting material and an electron transporting material.

5. An electronic device having the light-emitting device according to claim 1, wherein the electronic device is one selected from the group consisting of a video camera, digital camera, mobile computer, personal computer, and cellular phone.

6. The light-emitting device according to claim 1, wherein the substrate comprises a plastic member.

7. The light-emitting device according to claim 6, wherein the plastic member comprises at least one selected from the group consisting of polyimide, polyamide, acrylic resin, epoxy resin, polyether sulfone, polycarbonate, polyethylene terephthalate and polyether nitrile.

8. A light-emitting device comprising:
a first light-emitting element over a substrate; and
a second light-emitting element over the substrate,
wherein the first light-emitting element comprises a mixed region between a pair of electrodes,
wherein the first light-emitting element comprises a material capable of emitting light from a triplet excitation state,
wherein the second light-emitting element comprises a material capable of emitting light from a singlet excitation state,
wherein the material capable of emitting light from the triplet excitation state includes an iridium complex exhibiting red color light emission,
wherein the mixed region comprises the material capable of emitting light from the triplet excitation state, and
wherein the material capable of emitting light from the triplet excitation state is a dopant.

9. The light-emitting device according to claim 8, wherein the material capable of emitting light from the singlet excitation state exhibits blue color light emission.

10. The light-emitting device according to claim 8, wherein the first light-emitting element and the second light-emitting element are not overlapped with each other.

11. The light-emitting device according to claim 8, wherein the mixed region comprises a hole transporting material and an electron transporting material.

12. An electronic device having the light-emitting device according to claim 8, wherein the electronic device is one selected from the group consisting of a video camera, digital camera, mobile computer, personal computer, and cellular phone.

13. The light-emitting device according to claim 8, wherein the substrate comprises a plastic member.

14. The light-emitting device according to claim 13, wherein the plastic member comprises at least one selected from the group consisting of polyimide, polyamide, acrylic resin, epoxy resin, polyether sulfone, polycarbonate, polyethylene terephthalate and polyether nitrile.

15. A light-emitting device comprising:
a first transistor over a substrate;
a second transistor over the substrate;
a first light-emitting element over the first transistor; and
a second light-emitting element over the second transistor,
wherein the first light-emitting element comprises a mixed region between a pair of electrodes,
wherein the first light-emitting element comprises a material capable of emitting light from a triplet excitation state,
wherein the second light-emitting element comprises a material capable of emitting light from a singlet excitation state,
wherein the mixed region comprises the material capable of emitting light from the triplet excitation state, and
wherein the material capable of emitting light from the triplet excitation state is a dopant.

16. The light-emitting device according to claim 15, wherein the material capable of emitting light from the singlet excitation state exhibits blue color light emission.

17. The light-emitting device according to claim 15, wherein the first light-emitting element and the second light-emitting element are not overlapped with each other.

18. The light-emitting device according to claim 15, wherein the mixed region comprises a hole transporting material and an electron transporting material.

19. An electronic device having the light-emitting device according to claim 15, wherein the electronic device is one selected from the group consisting of a video camera, digital camera, mobile computer, personal computer, and cellular phone.

20. The light-emitting device according to claim 15, wherein the substrate comprises a plastic member.

21. The light-emitting device according to claim 20, wherein the plastic member comprises at least one selected from the group consisting of polyimide, polyamide, acrylic resin, epoxy resin, polyether sulfone, polycarbonate, polyethylene terephthalate and polyether nitrile.

* * * * *